(12) United States Patent
Lee et al.

(10) Patent No.: US 10,319,784 B2
(45) Date of Patent: Jun. 11, 2019

(54) SEMICONDUCTOR DEVICE INCLUDING VARIABLE RESISTANCE MEMORY DEVICE

(71) Applicant: Samsung Electronics Co., Ltd., Suwon-si, Gyeonggi-do (KR)

(72) Inventors: Kil-ho Lee, Busan (KR); Yoon-jong Song, Seoul (KR); Gwan-hyeob Koh, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/858,349

(22) Filed: Dec. 29, 2017

(65) Prior Publication Data

US 2018/0350876 A1    Dec. 6, 2018

(30) Foreign Application Priority Data

Jun. 2, 2017  (KR) .................. 10-2017-0069077

(51) Int. Cl.
```
H01L 27/22      (2006.01)
H01L 43/02      (2006.01)
H01L 43/08      (2006.01)
G11C 11/16      (2006.01)
H01L 43/12      (2006.01)
```

(52) U.S. Cl.
CPC .......... *H01L 27/228* (2013.01); *G11C 11/161* (2013.01); *H01L 43/02* (2013.01); *H01L 43/08* (2013.01); *H01L 43/12* (2013.01)

(58) Field of Classification Search
CPC combination set(s) only.
See application file for complete search history.

(56) References Cited

U.S. PATENT DOCUMENTS

| | | | |
|---|---|---|---|
| 8,362,581 B2 | 1/2013 | Takenaga et al. | |
| 8,558,334 B2 | 10/2013 | Ueki et al. | |
| 9,502,466 B1 | 11/2016 | Chuang et al. | |
| 2013/0051117 A1 | 2/2013 | En et al. | |
| 2014/0164688 A1 | 6/2014 | Lee et al. | |
| 2014/0264668 A1 | 9/2014 | Lee et al. | |
| 2016/0254440 A1 | 9/2016 | Wang et al. | |
| 2016/0268336 A1 | 9/2016 | Shum et al. | |
| 2017/0040338 A1* | 2/2017 | Lee | H01L 27/11582 |
| 2019/0006416 A1* | 1/2019 | Lee | H01L 27/228 |

FOREIGN PATENT DOCUMENTS

JP   5695453   2/2015

* cited by examiner

*Primary Examiner* — Mamadou L Diallo
(74) *Attorney, Agent, or Firm* — Myers Bigel, P.A.

(57) ABSTRACT

A semiconductor device includes a substrate including a memory cell region and a logic region; a variable resistance memory device on the memory cell region; a logic device on the logic region; a first horizontal bit line extending in a horizontal direction on a surface of the substrate on the memory cell region and electrically connected to the variable resistance memory device; a second horizontal bit line extending in a horizontal direction on the surface of the substrate on the logic region and electrically connected to the logic device; and a vertical bit line electrically connected to the first horizontal bit line and the second horizontal bit line and extending perpendicular to the surface of the substrate.

20 Claims, 21 Drawing Sheets

US 10,319,784 B2

SEMICONDUCTOR DEVICE INCLUDING VARIABLE RESISTANCE MEMORY DEVICE

CROSS-REFERENCE TO RELATED APPLICATION

This application claims the benefit of Korean Patent Application No. 10-2017-0069077, filed on Jun. 2, 2017, in the Korean Intellectual Property Office, the disclosure of which is incorporated herein in its entirety by reference.

BACKGROUND

The inventive concepts relate to semiconductor devices including variable resistance memory devices, and more particularly, to semiconductor devices including variable resistance memory devices and logic devices.

Electronic devices have become increasingly smaller and lighter in accordance with the rapid development of the electronic industry and demands of users. Thus, an embedded semiconductor device in which memory devices and logic devices are integrated on a single chip has been proposed. Research has been conducted to simultaneously improve the operational performance of the memory devices and the operational performance of the logic devices in such an embedded semiconductor device.

SUMMARY

Some embodiments of the inventive concepts provide semiconductor devices with improved reliability and operation performance.

However, the inventive concepts are not limited thereto and may be variously extended without departing from the spirit and scope of the present invention.

According to some aspects of the inventive concepts, a semiconductor device includes: a substrate including a memory cell region and a logic region; a variable resistance memory device on the memory cell region; a logic device on the logic region; a first horizontal bit line extending in a horizontal direction on an upper surface of the substrate on the memory cell region and electrically connected to the variable resistance memory device; a second horizontal bit line extending in a horizontal direction on the upper surface on the logic region and electrically connected to the logic device; and a vertical bit line electrically connected to the first horizontal bit line and the second horizontal bit line and extending in a first direction perpendicular to the upper surface.

According to further aspects of the inventive concepts, a semiconductor device includes: a substrate wherein a memory cell region and a logic region are defined; a first insulating layer on the substrate; a second insulating layer disposed between the first insulating layer and the substrate and having a dielectric constant different from that of the first insulating layer; a variable resistance memory device in the first insulating layer; a first horizontal bit line connected to the variable resistance memory device and extending in a direction parallel to an upper surface of the substrate; a second horizontal bit line penetrating at least a portion of the second insulating layer in a direction parallel to the upper surface; and a vertical bit line penetrating at least a portion of the first insulating layer in a direction perpendicular to the upper surface and connected to the first horizontal bit line and the second horizontal bit line.

According to still further aspects of the inventive concepts, a semiconductor device includes: a substrate wherein a memory cell region and a logic region are defined; a first insulating layer on the substrate; a second insulating layer disposed between the first insulating layer and the substrate and having a dielectric constant different from that of the first insulating layer; a variable resistance memory device in the first insulating layer on the cell region; a logic device on the logic region; a first horizontal bit line extending in a horizontal direction on an upper surface of the substrate on the memory cell region and electrically connected to the variable resistance memory device; a second horizontal bit line extending in a horizontal direction on the upper surface on the logic region and in the second insulating layer; and a vertical bit line extending in a first direction perpendicular to the upper surface and connected to the first horizontal bit line and the second horizontal bit line, wherein the variable resistance memory device is electrically connected to the logic device sequentially through the first horizontal bit line, the vertical bit line, and the second horizontal bit line.

According to yet further aspects of the inventive concepts, a semiconductor device includes a bit line that electrically connects a logic device and a variable resistance memory device in a logic region and a memory cell region of a substrate, respectively. A portion of the bit line extends along a surface the substrate in the logic region, and is disposed in a second insulating layer having a lower dielectric constant than a first insulating layer in which the variable resistance memory device is disposed.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF EMBODIMENTS

Figure 1A:
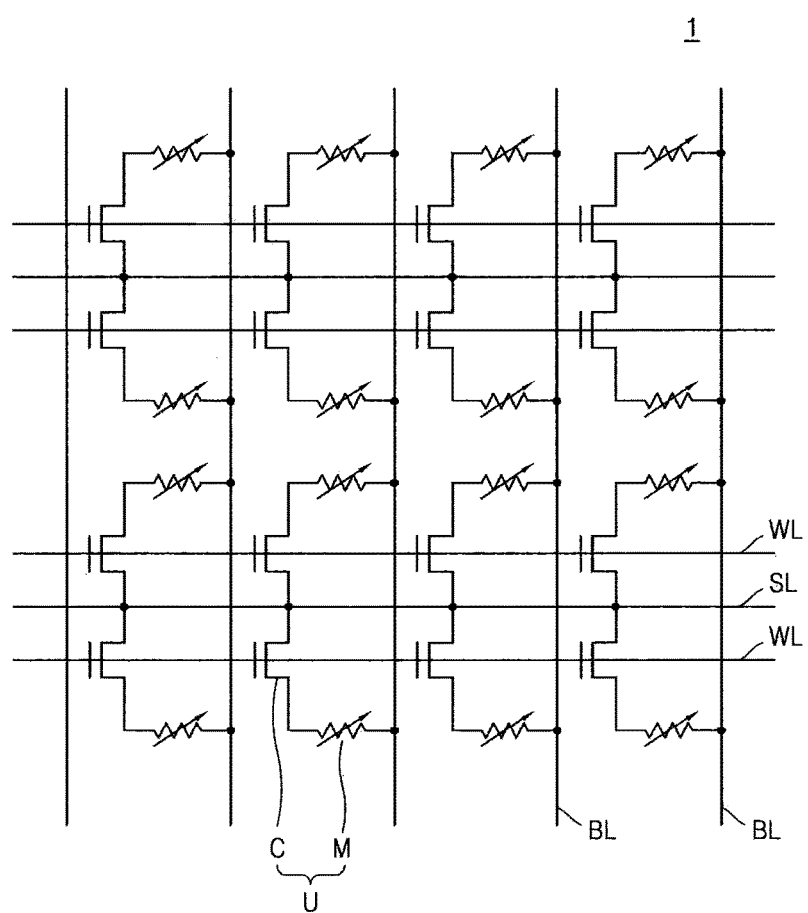
FIG. 1A is a circuit diagram for explaining a variable resistance memory array that may be included in a semiconductor device, according to some example embodiments.

Hereinafter, example embodiments will be described in detail with reference to the accompanying drawings. Like reference numerals in the drawings denote like elements, and thus their description will be omitted.

FIG. 1A is a circuit diagram for explaining a variable resistance memory array 1 that may be included in a semiconductor device, according to some example embodiments.

Referring to FIG. 1A, the variable resistance memory array 1 of the semiconductor device may include unit cells U arranged in a matrix form.

Each of the unit cells U may include an access unit C and a memory unit M. Each of the unit cells U may be electrically connected to word lines WL and bit lines BL. The word lines WL may be arranged substantially parallel to each other. The bit lines BL may be two-dimensionally arranged so as to be substantially parallel to each other and intersect the word lines WL. In some example embodiments, the access unit C may correspond to a transistor. When the access unit C corresponds to the transistor, source lines SL may be connected to a source of the access unit C. The access unit C controls supply of current to the memory unit M according to a voltage of the word lines WL.

The source lines SL may be arranged substantially parallel to each other. The source lines SL may extend along the same direction as the word lines WL. However, the inventive concepts are not limited thereto, and the source lines SL may extend along the same direction as the bit lines BL.

The memory unit M may include magnetic materials. In some example embodiments, the memory unit M may include elements having a magnetic tunnel junction (MTJ), also referred to herein as magnetic tunnel junction devices. In some example embodiments, the memory unit M may perform a memory function based on a spin transfer torque (STT) phenomenon so that a magnetization direction of a magnetic substance is changed by an input current.

The STT phenomenon is a phenomenon in which a magnetization direction of a magnetic layer is changed by a spin transfer of electrons when a spin-polarized current flows in one direction. Magnetic Random Access Memory (MRAM) using the STT phenomenon can be referred to as STT-RAM or STT-MRAM.

Figure 1B:
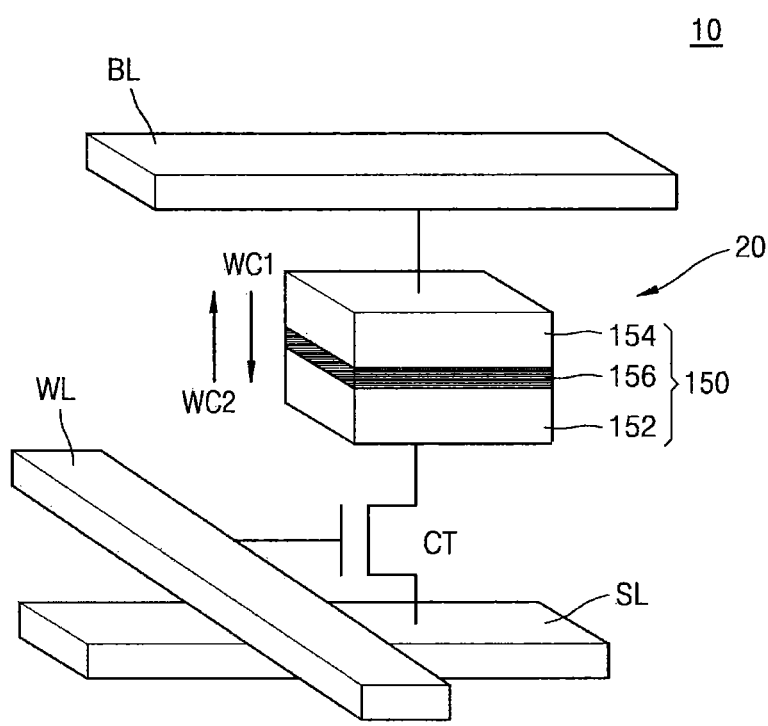
FIG. 1B is a perspective view for explaining a variable resistance memory device that may be included in a semiconductor device, according to some example embodiments.

FIG. 1B is a perspective view for explaining a variable resistance memory device 10 that may be included in the semiconductor device, according to some example embodiments.

Referring to FIG. 1B, the variable resistance memory device 10 includes a memory cell 20 including STT-MRAM. The memory cell 20 may correspond to the unit cells U of the variable resistance memory array 1 described with reference to FIG. 1.

The memory cell 20 may include a magnetoresistive element 150 having an MTJ structure and a cell transistor CT. A gate of the cell transistor CT may be connected to a word line WL. One of a source and a drain of the cell transistor CT may be connected to a bit line BL through the magnetoresistive element 150 and the other may be connected to a source line SL. The cell transistor CT may correspond to the access unit C of the variable resistance memory array 1 described with reference to FIG. 1A.

The magnetoresistive element 150 includes a free layer 152, a pinned layer 154, and a tunnel barrier 156 interposed therebetween. The free layer 152 has a magnetization easy axis perpendicular or horizontal to an extending direction of the free layer 152 and a magnetization direction is variable depending on conditions. A magnetization direction of the pinned layer 154 is pinned with respect to the magnetization easy axis perpendicular or horizontal to an extending direction of the magnetoresistive element 150.

The free layer 152 and the pinned layer 154 may include a magnetic material having high magnetic anisotropy energy. Materials with large magnetic anisotropy energy include amorphous rare earth element alloys, a multilayer thin film such as $(Co/Pt)_n$ or $(Fe/Pt)_n$, and an ordered lattice material of an L10 crystal structure.

In some example embodiments, at least one of the free layer 152 and the pinned layer 154 may each include at least one of iron (Fe), cobalt (Co), nickel (Ni), palladium (Pd), or platinum (Pt). In some example embodiments, at least one of the free layer 152 and the pinned layer 154 may include a Co-M1 alloy (where M1 is at least one of Pt, Pd, or Ni), or a Fe-M2 alloy (where M2 is at least one of Pt, Pd, or Ni). In some example embodiments, at least one of the free layer 152 and the pinned layer 154 may each further include at least one of boron (B), carbon (C), copper (Cu), silver (Ag), gold (Au), ruthenium (Ru), tantalum (Ta), or chromium (Cr).

The tunnel barrier 156 may include a non-magnetic material. The tunnel barrier 156 may include, for example, an oxide of any one material selected from magnesium (Mg), titanium (Ti), aluminum (Al), MgZn, and MgB. In some example embodiments, the tunnel barrier 156 may include Ti nitride or vanadium (V) nitride. The tunnel barrier 156 may have a thickness less than a spin diffusion distance.

A resistance value of the magnetoresistive element 150 varies depending on a magnetization direction of the free layer 152. When the magnetization direction of the free layer 152 is parallel to a magnetization direction of the pinned layer 154, the magnetoresistive element 150 has a low resistance value and may store data '0'. When the magnetization direction of the free layer 152 is antiparallel to the magnetization direction of the pinned layer 154, the magnetoresistive element 150 has a high resistance value and may store data '1'. The arrangement of the free layer 152 and the pinned layer 154 shown in FIG. 1B is exemplary and each position may be reversed.

In the variable resistance memory device 10 shown in FIG. 1B, the cell transistor CT is turned on by applying a logic high voltage to a word line WL for a write operation of the STT-MRAM, and write currents WC1 and WC2 are applied between the source line SL and the source line SL. The magnetization direction of the free layer 152 may be determined according to directions of the write currents WC1 and WC2. The magnetization direction of the free layer 152 in the magnetoresistive element 150 may be changed by the STT phenomenon.

In more detail, when the write currents WC1 and WC2 in the STT-MRAM flow to the magnetoresistive element 150, the pinned layer 154 may polarize an electron spin of the write currents WC1 and WC2. The spin-polarized write currents WC1 and WC2 may interact with the free layer 152 while applying a torque to the free layer 152. When the torque transmitted to the free layer 152 by the spin-polarized write currents WC1 and WC2 passing through the magnetoresistive element 150 is greater than a predetermined threshold value, the magnetization direction of the free layer 152 may be switched by the spin-polarized write currents WC1 and WC2. Accordingly, the magnetization direction of the free layer 152 may be arranged parallel or antiparallel to the pinned layer 154, and a resistance state of the magnetoresistive element 150 may be changed.

Since the STT-MRAM switches the magnetization direction of the free layer 152 through the spin-polarized write currents WC1 and WC2, the application of a strong external magnetic field to switch the magnetization direction of the free layer 152 is not necessary. A reduction in intensity of a magnetic field required for the switching implies a reduction in a switching current, so that the STT-MRAM may reduce a write current as well as a cell size reduction and solve a write failure problem. In addition, the STT-MRAM may have a high-tunnel magnetoresistance ratio and a high ratio between logic high and logic low resistance states to improve read operation performance in a magnetic domain.

In the variable resistance memory device 10 shown in FIG. 1B, for a read operation of the STT-MRAM, the cell transistor CT is turned on by applying a logic high voltage to the word line WL and applies a read current in a direction of the source line SL from the bit line BL, thereby discriminating data stored in the magnetoresistive element 150. Here, the read current does not change the magnetization direction of the free layer 152 because magnitude of the read current is much smaller than magnitude of the write currents WC1 and WC2.

Figure 2A:
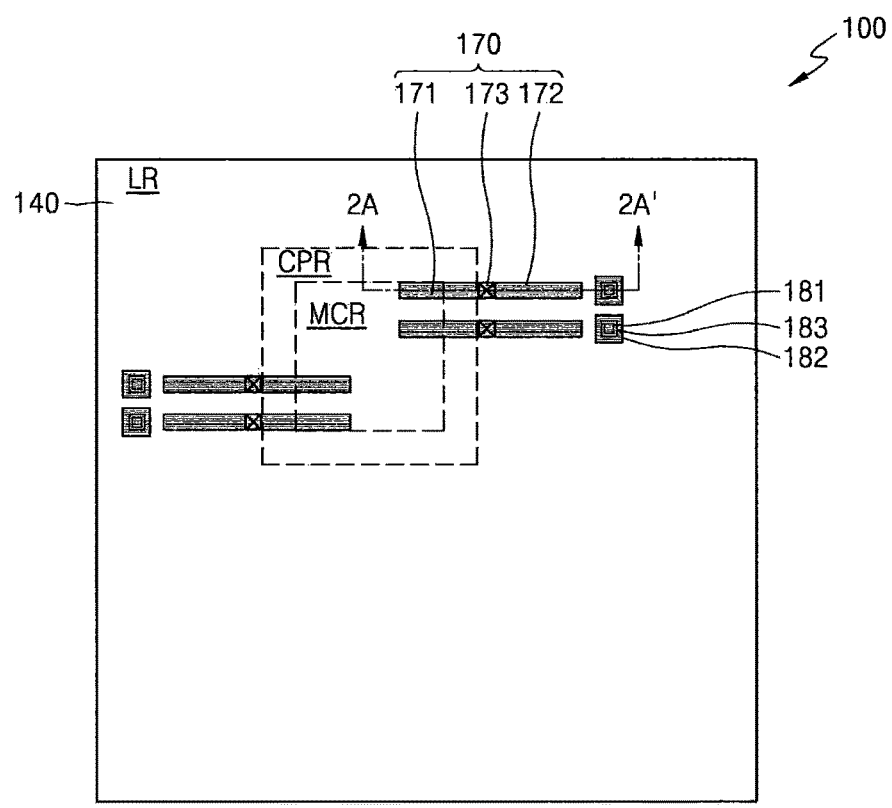
FIG. 2A is a plan view for explaining a semiconductor device including a variable resistance memory device, according to some example embodiments.
Figure 2B:
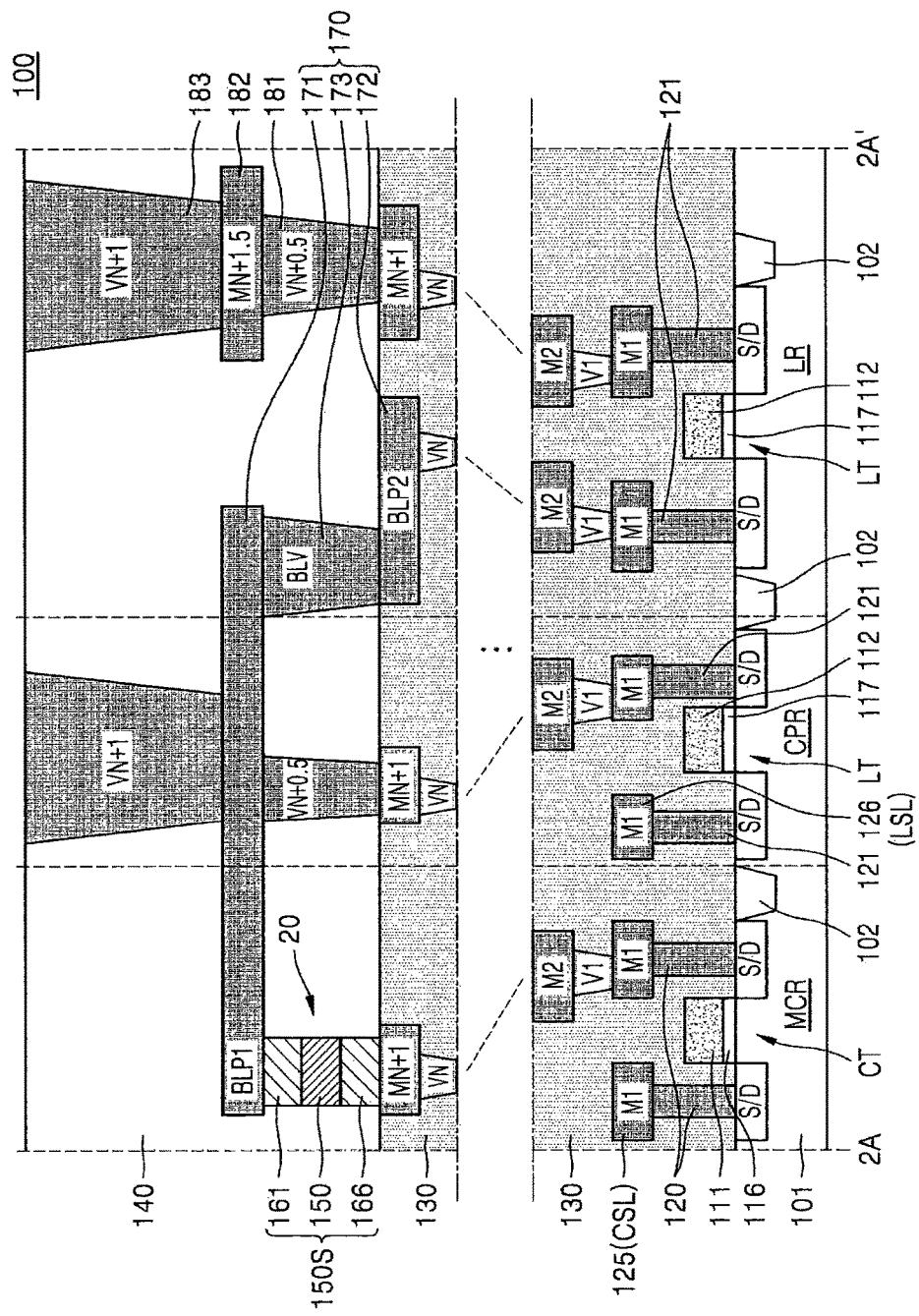
FIG. 2B is a cross-sectional view taken along a line 2A-2A' of FIG. 2A.

FIG. 2A is a plan view for explaining a semiconductor device 100 including a variable resistance memory device, according to some example embodiments. FIG. 2B is a cross-sectional view taken along a line 2A-2A' of FIG. 2A.

Referring to FIGS. 2A and 2B, a semiconductor device 100 may include a substrate 101. The substrate 101 may include at least one of a group III-V material or a group IV material. The substrate 101 may include a semiconductor device such as germanium (Ge) or a compound semiconductor such as silicon germanium (SiGe), silicon carbide (SiC), gallium arsenide (GaAs), indium arsenide (InAs), or indium phosphide (InP). The group III-V material may include a binary, a trinary, or a quarternary compound including at least one group III element and at least one group V element. The group III-V material may be a compound including at least one element of indium (In), gallium (Ga), or aluminum (Al) as the group III element, and at least one element of arsenic (As), phosphorus (P), or antimony (Sb) as the group V element. For example, the group III-V material may be selected from InP, $In_zGa_{1-z}As$ ($0 \leq z \leq 1$), or $Al_zGa_{1-z}As$ ($0 \leq z \leq 1$). The binary compound may be one of, for example, InP, GaAs, InAs, indium antimonide (InSb), or Gallium antimonide (GaSb). The trinary compound may be one of InGaP, InGaAs, AlInAs, InGaSb, GaAsSb or GaAsP. The group IV material may be Si or Ge. However, the group III-V material or the group IV material usable in a semiconductor device according to some example embodiments are not limited thereto.

According to some example embodiments, the substrate 101 may have a silicon on insulator (SOI) structure. In another example, the substrate 101 may include a buried oxide (BOX) layer. The substrate 101 may include a conductive region, such as an impurity-doped well, or an impurity-doped structure.

An element isolation layer 102 for defining an active region on the substrate 101 may be formed. Referring to FIG. 2B, the element isolation layer 102 has a shallow trench isolation (STI) structure, but is not limited thereto. That is, the element isolation layer may have various structures such as a deep trench isolation (DTI) structure in addition to the STI.

A memory cell region MCR, a memory cell core or peripheral (core/peri) region CPR, and a logic region LR may be defined on the substrate 101. Referring to FIG. 2A, the memory cell region MCR is located at the center of the core/peri region CPR so that the substrate 101 has a layout in which the core/peri region CPR surrounds the memory cell region MCR, but the inventive concepts are not limited thereto. For example, the core/peri region CPR may be located at the center of the memory cell region MCR so that the substrate 101 may have a layout in which the memory cell region MCR surrounds the core/peri region CPR. The magnetoresistive element 150 corresponding to MRAM may be in the memory cell region MCR.

The core/peri region CPR may include an input/output circuit, a voltage generator, a control logic circuit, and the like. The input/output circuit may be connected to address decoders and page buffer circuits. The input/output circuit may include a global buffer for temporarily storing instructions, addresses, and data received from a memory controller. The page buffer circuits may share a global buffer included in the input/output circuit.

Various logic devices may be formed in the logic region LR. The logic region LR may include a main processing unit (MPU), a graphics processing unit (GPU), an interface, or other functional blocks. Although not shown, the logic region LR may further include an analog region where analog elements are formed.

The semiconductor device 100 may be an embedded semiconductor device in which a memory device and a logic device are integrated together on a single chip. Although one memory cell region MCR and one logic region LR are shown in FIG. 2A, the inventive concepts are not limited thereto.

The memory cell 20 including the STT-MRAM may be on the memory cell region MCR. The memory cell 20 may include the magnetoresistive element 150 having an MTJ structure and the cell transistor CT. The cell transistor CT may include a gate insulating layer 116 on the substrate 101, a gate electrode 111, and source/drain regions S/D on the substrate 101 on both sides of the gate electrode 111. The gate electrode 111 of the cell transistor CT may be connected to a word line. One of the source/drain regions S/D of the cell transistor CT may be connected to the bit line BL through the magnetoresistive element 150 and the other may be connected to the source line SL.

A second insulating layer 130 may be on the substrate 101. Although not shown, the second insulating layer 130 may include a plurality of interlayer insulating films sequentially stacked. The second insulating layer 130 may have a lower dielectric constant than that of an oxide film or a silicon oxide film. The second insulating layer 130 may include, for example, silicon oxycarbide (SiOC) or hydrogenated SiOC (SiCOH). The dielectric constant of the second insulating layer 130 may be less than about 3.5, but is not limited thereto. The second insulating layer 130 may include a low-dielectric (low-k or LK) material and/or an ultra low-dielectric (ultra low-k or ULK) material. Diffusion preventing layers for preventing characteristics of conductive wiring layers (M1, M2, . . . , and MN+1) and conductive vias (V1, . . . , VN) from deteriorating may be disposed between the conductive wiring layers (M1, M2, . . . , and MN+1) and the second insulating layer 130, and between the conductive vias (V1, . . . , VN) and the second insulating layer 130. The diffusion preventing layer may be, for example, a SiC film or a silicon nitride (SiN) film.

The conductive interconnection layers (M1, M2, ..., and MN+1), the conductive vias (V1, ..., VN), and source/drain contacts 120 and 121 may be arranged in the second insulating layer 130, where N may be a positive integer.

The conductive wiring layers (M1, M2, ..., and MN+1) may penetrate at least a portion of the second insulating layer 130 in a direction parallel to an upper surface of the substrate 101. The conductive vias (V1, ..., VN) and the source/drain contacts 120 and 121 may penetrate at least a portion of the second insulating layer 130 in a direction perpendicular to the upper surface of the substrate 101. The conductive vias (V1, ..., VN) may extend in a direction perpendicular to the upper surface of the substrate 101 and have a pillar shape.

A barrier layer and a seed layer may be on side surfaces and/or lower surfaces of the conductive wiring layers (M1, M2, ..., and MN+1), the conductive vias (V1, ..., VN), and the source/drain contacts 120 and 121.

The conductive wiring layers (M1, M2, ..., and MN+1), the conductive vias (V1, ..., VN), and/or the source/drain contacts 120 and 121 may include one or more conductive materials. For example, the conductive wiring layers (M1, M2, ..., and MN+1), the conductive vias (V1, ..., VN), and/or the source/drain contacts 120 and 121 may include, but are not limited to, at least one metal or metal alloy selected from among Cu, Ni, Ag, Au, Pt, tin (Sn), lead (Pb), Ti, Cr, Pd, In, zinc (Zn), or C.

The barrier layer may include Ta, Ti, tantalum nitride (TaN), titanium nitride (TiN), or a combination thereof. The seed layer may include materials included in the conductive wiring layers (M1, M2, ..., and MN+1), the conductive vias (V1, ..., VN), and/or the source/drain contacts 120 and 121.

Some of the conductive wiring layers M1 from among the conductive wiring layers (M1, M2, ..., and MN+1) may constitute or define a cell source line CSL and/or a logic source line LSL. The cell source line CSL may correspond to the source lines SL (see FIG. 1A) described with reference to FIGS. 1A and 1B. Some of the conductive wiring layers (M1, M2, ..., and MN+1) may constitute or define respective word lines, but are not limited thereto.

According to some example embodiments, the gate insulating layer 116 may include at least one of a silicon oxide layer, a silicon nitride layer, a silicon oxynitride layer, an oxide/nitride/oxide (ONO) layer, or a high-dielectric (high-k) layer having a dielectric constant higher than that of the silicon oxide layer. For example, the gate insulating layer 116 may have a dielectric constant of about 10 to 25. In some example embodiments, the gate insulating layer 116 may include at least one of hafnium oxide (HfO), hafnium silicate (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), or lead scandium tantalum oxide (PbScTaO). According to some example embodiments, the gate insulating layer 116 may include hafnium oxide ($HfO_2$), aluminum oxide ($Al_2O_3$), hafnium aluminum oxide ($HfAlO_3$), tantalum oxide ($Ta_2O_3$), or titanium oxide ($TiO_2$).

According to some example embodiments, the gate electrode 111 may include at least one of a doped semiconductor, a metal, a conductive metal nitride, or a metal-semiconductor compound. In some embodiments, the gate electrode 111 may include at least one of Ti, TiN, Ta, TaN, tungsten (W), tungsten nitride (WN), titanium silicide nitride (TiSiN), or tungsten silicide nitride (WSiN), but is not limited thereto. The gate electrode 111 may be on the substrate 101 as illustrated in FIG. 2B, but is not limited thereto. For example, the semiconductor device 100 may include a gate electrode of a structure embedded in the substrate 101 such that an upper surface of the gate electrode 111 is located at a lower level than the upper surface of the substrate 101.

A first insulating layer 140 may be on the second insulating layer 130. The second insulating layer 130 may be interposed between the first insulating layer 140 and the substrate 101. The first insulating layer 140 may be a material having a good gap fill property. The first insulating layer 140 may include an oxide, a nitride and/or an oxynitride. A dielectric constant of the first insulating layer 140 may be different from that of the second insulating layer 130. The dielectric constant of the first insulating layer 140 may be greater than that of the second insulating layer 130. The dielectric constant of the first insulating layer 140 may be about 3.5 or more, but is not limited thereto.

A variable resistance structure 150S may be formed in the first insulating layer 140 of the memory cell region MCR, such that the variable resistance structure 150S is disposed in or otherwise surrounded by the first insulating layer 140. The variable resistance structure 150S may include a lower electrode 166, a magnetoresistive element 150, and an upper electrode 161 which are sequentially stacked. The lower electrode 166 and the upper electrode 161 may include a conductive material. An upper portion of the upper electrode 161 may be used to pattern the lower electrode 166, the magnetoresistive element 150, and/or the upper electrode 161 and may include a residual mask pattern 163P (see FIG. 8C).

The lower electrode 166 and the upper electrode 161 may include a conductive material having a relatively low reactivity. In some example embodiments, the lower electrode 166 and the upper electrode 161 may each have a monolayer structure including at least one of Ti, Ta, Ru, Al, W, TaN, or TiN, or a multilayer structure including a plurality of material layers. A lower surface of the lower electrode 166 and a lower surface of the first insulating layer 140 may be coplanar or on a substantially identical plane.

The lower electrode 166 of the variable resistance structure 150S may be electrically connected to the substrate 101 passing through the conductive wiring layers (M1, M2, ..., and MN+1), the conductive vias (V1, ..., VN), and/or the source/drain contacts 120 and 121.

A bit line structure 170 may be on the substrate 101. The bit line structure 170 may penetrate a portion of the first insulating layer 140 and a portion of the second insulating layer 130. The bit line structure 170 may include a first horizontal bit line 171 (BLP1), a second horizontal bit line 172 (BLP2), and a vertical bit line 173 (BLV). As referred to herein, elements described as horizontal (such as the first and second horizontal bit lines 171 and 172) extend parallel to or along the surface of the substrate 101, while elements described as vertical (such as the vertical bit line 173) extend perpendicular to or away from the surface of the substrate 101. The bit line structure 170 may correspond to the bit line BL described with reference to FIGS. 1A and 1B.

A first horizontal bit line 171 may extend in a direction parallel to the upper surface of the substrate 101. The first horizontal bit line 171 may penetrate at least a portion of the first insulating layer 140. The first horizontal bit line 171 may be disposed over the second insulating layer 130. The first horizontal bit line 171 may extend over the memory cell region MCR. The first horizontal bit line 171 may extend over the core/peri region CPR. The first horizontal bit line 171 may extend over a portion of the logic region LR adjacent to the core/peri region CPR and/or a portion of the logic region LR adjacent to the memory cell region MCR. At least a portion of a lower surface of the first horizontal bit line 171 may be electrically connected to the upper electrode 161. At least a portion of the lower surface of the first horizontal bit line 171 may be connected to physically contact the upper electrode 161.

A second horizontal bit line 172 may extend in a direction parallel to the upper surface of the substrate 101. The second horizontal bit line 172 may extend over the logic region LR. The second horizontal bit line 172 may penetrate at least a portion of the second insulating layer 130. The second horizontal bit line 172 may be disposed under the first insulating layer 140. An upper surface of the second horizontal bit line 172 and an upper surface of the second insulating layer 130 may be coplanar or on a substantially identical plane. Accordingly, the first horizontal bit line 171 may be farther away from the upper surface of the substrate 101 than the second horizontal bit line 172.

The vertical bit line 173 may extend in a direction perpendicular to the upper surface of the substrate 101. The vertical bit line 173 may penetrate at least a portion of the first insulating layer 140. The vertical bit line 173 may extend over the logic region LR adjacent to the core/peri region CPR and/or the memory cell region MCR. The vertical bit line 173 may be electrically connected to the first and second horizontal bit lines 171 and 172. The vertical bit line 173 may physically contact the first and second horizontal bit lines 171 and 172. An upper surface of the vertical bit line 173 may be in contact with the lower surface of the first horizontal bit line 171. A lower surface of the vertical bit line 173 may be in contact with the upper surface of the second horizontal bit line 172. A vertical length or height of the vertical bit line 173 may be substantially the same as that of the variable resistive structure 150S. The upper and lower surfaces of the vertical bit line 173 may be formed at substantially the same level as or coplanar with upper and lower surfaces of the variable resistance structure 150S, respectively. A width of the vertical bit line 173 may be greater than those of the conductive vias (V1, . . . , VN) formed in the second insulating layer 130. Thus, a contact resistance of the vertical bit line 173 may be reduced as compared to the vias (V1, . . . , VN).

As described below, an operation of forming the variable resistance structure 150S includes sequentially forming a plurality of material layers, and performing a singulation process on the material layers. A first insulating layer 140 filling between the variable resistance structure 150S may be provided. The first insulating layer 140 may be formed of a material having a good gap fill property. On the other hand, the logic region LR may adopt an insulating layer including a material having a low-dielectric constant, to reduce or prevent RC delay (resistive-capacitive delay) or the like. In order to satisfy both of these requirements simultaneously, some of the conductive wiring layers (M1, M2, . . . , and MN+1) and some of the conductive vias (V1, . . . , VN) may be formed in the second insulating layer 130, which is a low-dielectric constant layer/ultra low-dielectric constant layer, and the variable resistance structure 150S may be formed in the first insulating layer 140 having a good gap fill property.

The first horizontal bit line 171 in the first insulating layer 140 extends over a portion of the logic region LR adjacent to the core/peri region CPR and/or a portion of the logic region LR adjacent to the memory cell region MCR, and the second horizontal bit line 172 in the second insulating layer 130, which is a low-dielectric constant layer/ultra low-dielectric constant layer, extends in the logic region LR to reduce or prevent RC delay. Furthermore, since the semiconductor device 100 including the embedded magnetoresistive element 150 is provided, there may be no need to change the designed or existing IP, which may be efficient in terms of design and manufacturing.

The bit line structure 170 may include a conductive material. The bit line structure 170 may have substantially the same composition as the conductive wiring layers (M1, M2, . . . , and MN+1), the conductive vias (V1, . . . , VN), and/or the source/drain contacts 120 and 121 described above, but is not limited thereto.

Conductive wiring layers (MN+1.5) and conductive vias (VN+0.5 and VN+1) may be formed in the first insulating layer 140. Some of the conductive vias (VN+0.5) may be located at substantially the same level as or may have surfaces that are coplanar with the variable resistance structure 150S. Some of the conductive vias (VN+1) may be formed in or on the first horizontal bit line 171. Some of the conductive wiring layers (MN+1.5) may be located at substantially the same level as or may have surfaces that are coplanar with the first horizontal bit line 171. The conductive wiring layers 182 (MN+1.5) on the logic region LR may serve as a kind of stud.

A logic transistor LT may be on the core/peri region CPR and/or the logic region LR. The logic transistor LT may include the gate insulating layer 117 on the substrate 101, the gate electrode 112, and the source/drain regions S/D on the substrate 101 on both sides of the gate electrode 112. The magnetoresistive element 150 may be connected to the logic transistor LT through the bit line structure 170, and the conductive wiring layers (M1, M2, . . . , and MN+1) and the conductive vias (V1, . . . , VN) formed in the second insulating layer 130 on the logic region LR. However, the inventive concepts are not limited thereto, and a selection element such as a diode may be provided instead of the logic transistor LT.

Figure 3A:
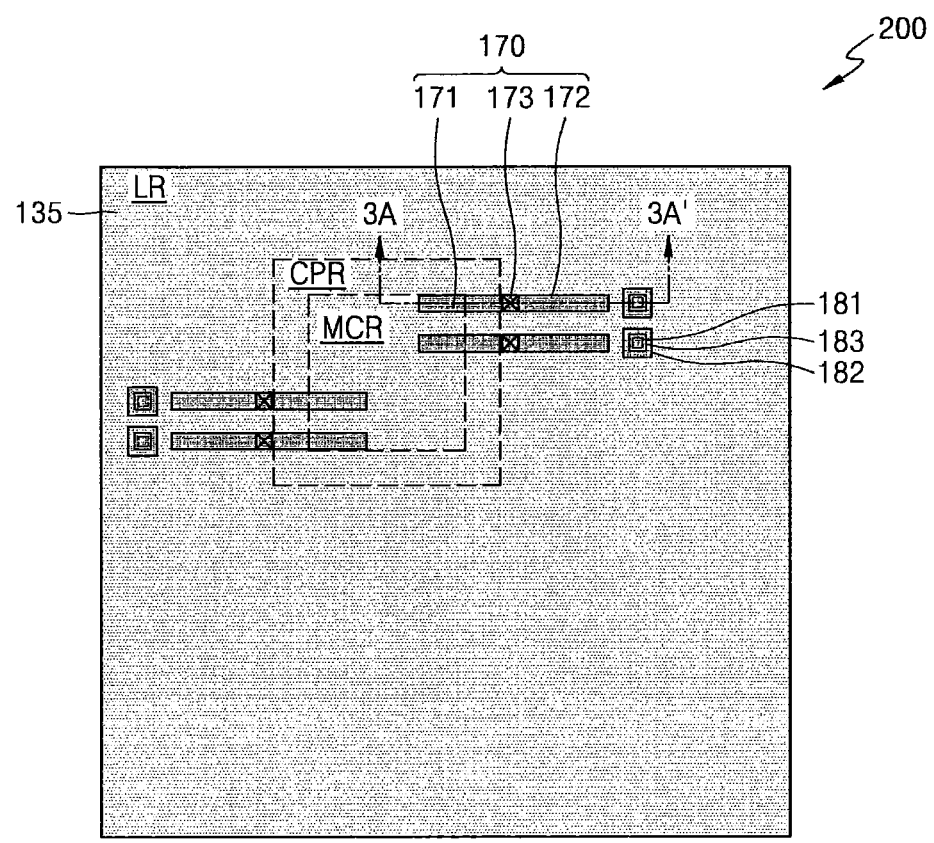
FIG. 3A is a plan view for explaining a semiconductor device including a variable resistance memory device, according to some example embodiments.
Figure 3B:
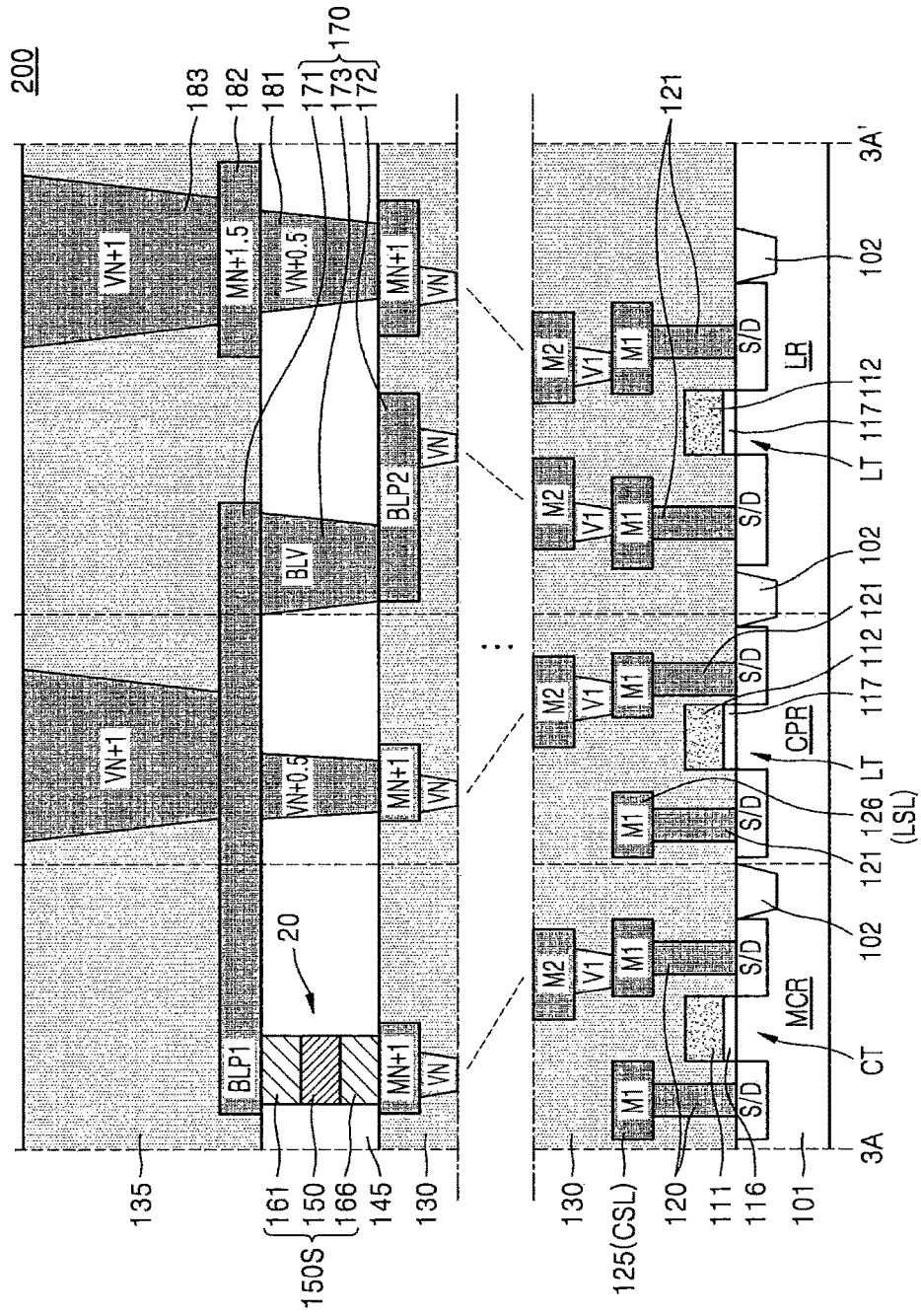
FIG. 3B is a cross-sectional view taken along a line 3A-3A' of FIG. 3A.

FIG. 3A is a plan view for explaining a semiconductor device 200 including a variable resistance memory device, according to some example embodiments. FIG. 3B is a cross-sectional view taken along a line 3A-3A' of FIG. 3A.

For convenience of description, in FIGS. 3A and 3B, the same reference numerals like in FIGS. 2A and 2B denote the same elements, and therefore, only differences will be mainly described.

Referring to FIGS. 3A and 3B, first and second insulating layers 145 and 130 may be provided on a substrate 101. The first insulating layer 145 may be on the second insulating layer 130. The second insulating layer 130 may be substantially the same as that described with reference to FIGS. 2A and 2B.

A composition of the first insulating layer 145 may be substantially the same as that described with reference to FIGS. 2A and 2B. A vertical length of the first insulating layer 145 may be substantially the same as that of the variable resistive structure 150S. The vertical length of the first insulating layer 145 may be substantially the same as that of the vertical bit line 173. The upper and lower surfaces of the first insulating layer 145 may be formed coplanar with or at substantially the same level as the upper and lower surfaces of the variable resistance structure 150S, respectively. The upper and lower surfaces of the first insulating layer 145 may be formed coplanar with or at substantially the same level as the upper and lower surfaces of the vertical bit line 173, respectively.

A third insulating layer 135 may be on the first insulating layer 145. The third insulating layer 135 may include a plurality of interlayer insulating layers sequentially stacked. The third insulating layer 135 may have a lower dielectric constant than that of an oxide film or a silicon oxide film. The dielectric constant of the third insulating layer 135 may be different from that of the first insulating layer 145. The dielectric constant of the third insulating layer 135 may be less than that of the first insulating layer 145. The third insulating layer 135 may include, for example, a SiOC film or a SiCOH film. The dielectric constant of the third insulating layer 135 may be less than about 3.5, but is not limited thereto. The third insulating layer 135 may include a low-k material and/or an ultra low-k material. Although not shown, diffusion preventing layers for preventing characteristics of the conductive wiring layers (MN+1) and the conductive vias (VN+1) from deteriorating may be disposed between the third insulating layer 135 and the conductive wiring layers (MN+1) and between the third insulating layer 135 and the conductive vias (VN+1). The diffusion preventing layer may be, for example, a SiC film or a SiN film.

The first horizontal bit line 171 may penetrate at least a portion of the third insulating layer 135 in a horizontal direction on the upper surface of the substrate 101. A lower surface of the third insulating layer 135 and the lower surface of the first horizontal bit line 171 may be coplanar or on a substantially identical plane.

According to some example embodiments, the variable resistance structure 150S, the conductive vias (VN+0.5), and the vertical bit line 173 formed at the same level as the variable resistance structure 150S may be formed in the first insulating layer 145 having a good gap fill property, and the other conductive wiring layers (M1, M2, . . . , and MN+1) and the conductive vias (V1, . . . , VN, and VN+1) may be formed in the second and third insulating layers 130 and 135, which are low-dielectric constant layer/ultra low-dielectric constant layer. Accordingly, the first horizontal bit line 171 is formed in the third insulating layer 135, which is a low-dielectric constant layer/ultra low-dielectric constant layer, and the second horizontal bit line 172 is formed in the second insulating layer 130, which is a low-dielectric constant layer/ultra low-dielectric constant layer, so that a semiconductor device in which RC delay is reduced may be provided.

Figure 4A:
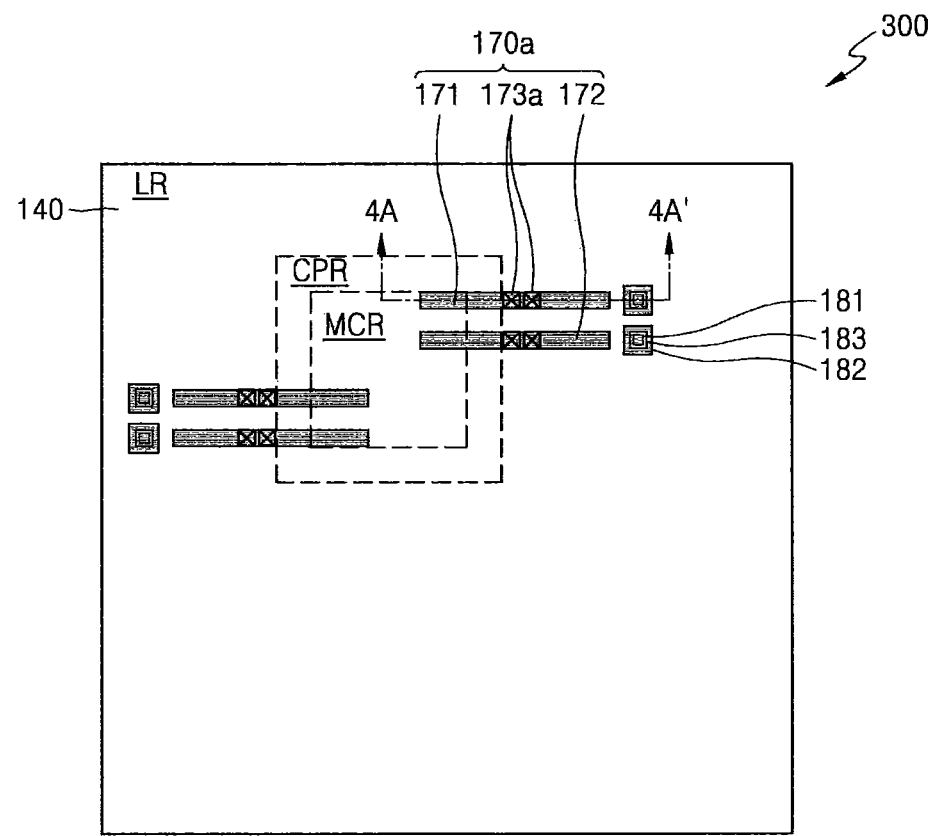
FIG. 4A is a plan view for explaining a semiconductor device including a variable resistance memory device, according to some example embodiments.
Figure 4B:
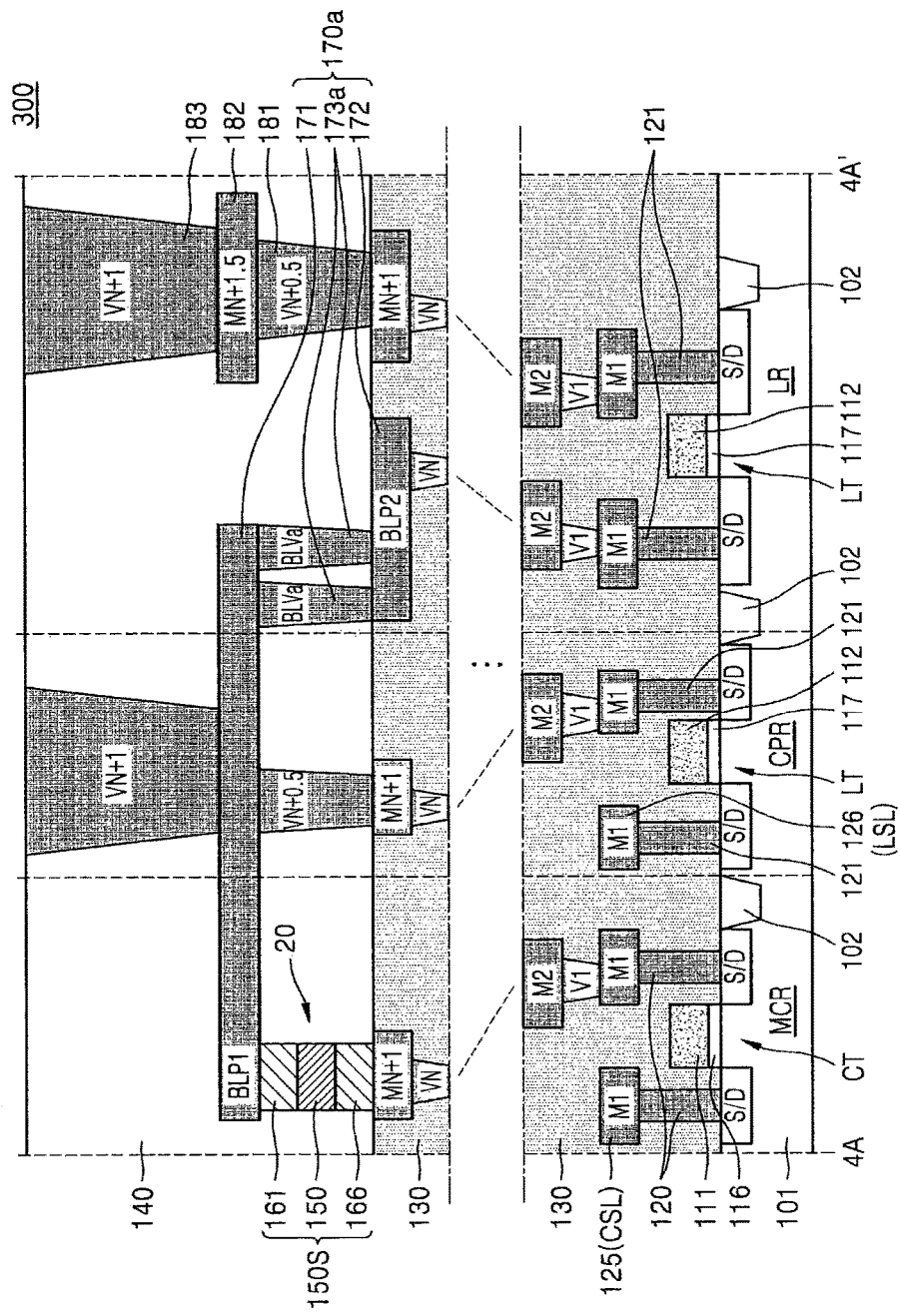
FIG. 4B is a cross-sectional view taken along a line 4A-4A' of FIG. 4A.

FIG. 4A is a plan view for explaining a semiconductor device 300 including a variable resistance memory device, according to some example embodiments. FIG. 4B is a cross-sectional view taken along a line 4A-4A' of FIG. 4A.

For convenience of description, in FIGS. 4A and 4B, the same reference numerals like in FIGS. 2A and 2B denote the same elements, and therefore, only differences will be mainly described.

Referring to FIGS. 4A and 4B, a bit line structure 170a may include a plurality of vertical bit lines 173a (BLVa). A vertical bit line 173a may extend in a direction perpendicular to the upper surface of the substrate 101. The vertical bit line 173a may penetrate at least a portion of the first insulating layer 140. The vertical bit line 173a may extend over a portion of the logic region LR adjacent to the core/peri region CPR and/or a portion of the logic region LR adjacent to the memory cell region MCR. The vertical bit line 173a may be electrically connected to the first and second horizontal bit lines 171 and 172. An upper surface of the vertical bit line 173a may be in contact with the lower surface of the first horizontal bit line 171. A lower surface of the vertical bit line 173a may be in contact with the upper surface of the second horizontal bit line 172. A vertical length or height of the vertical bit line 173a may be substantially the same as that of the variable resistive structure 150S. The upper and lower surfaces of the vertical bit line 173a may be coplanar with or located at substantially the same level as the upper and lower surfaces of the variable resistance structure 150S, respectively. Contact resistance of the vertical bit line 173a may be reduced by providing the plurality of vertical bit lines 173a.

Figure 5A:
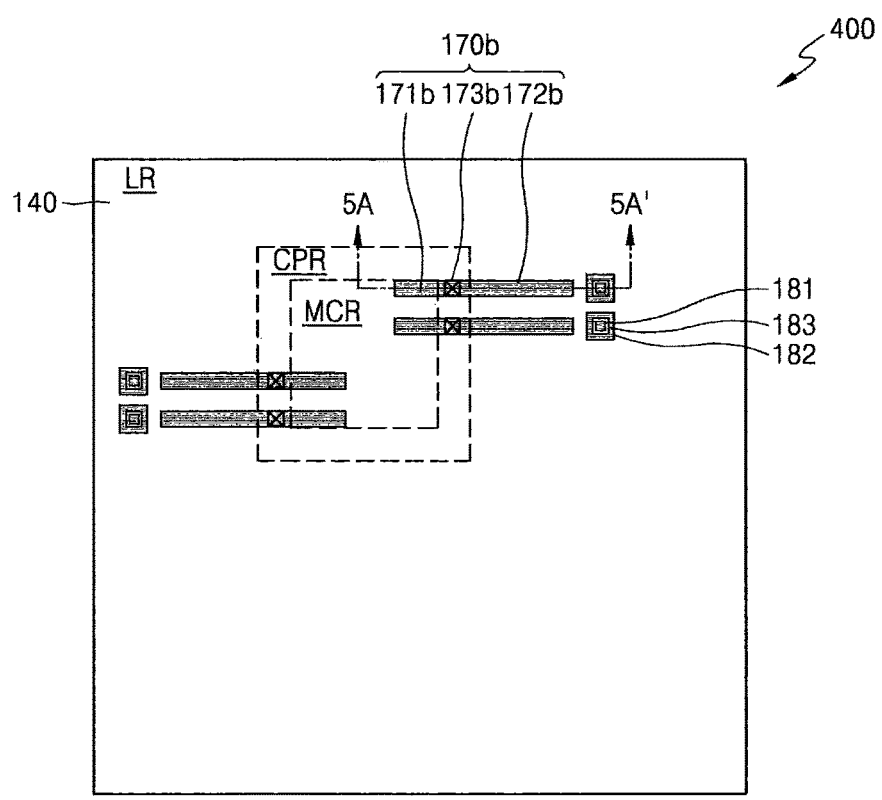
FIG. 5A is a plan view for explaining a semiconductor device including a variable resistance memory device, according to some example embodiments.
Figure 5B:
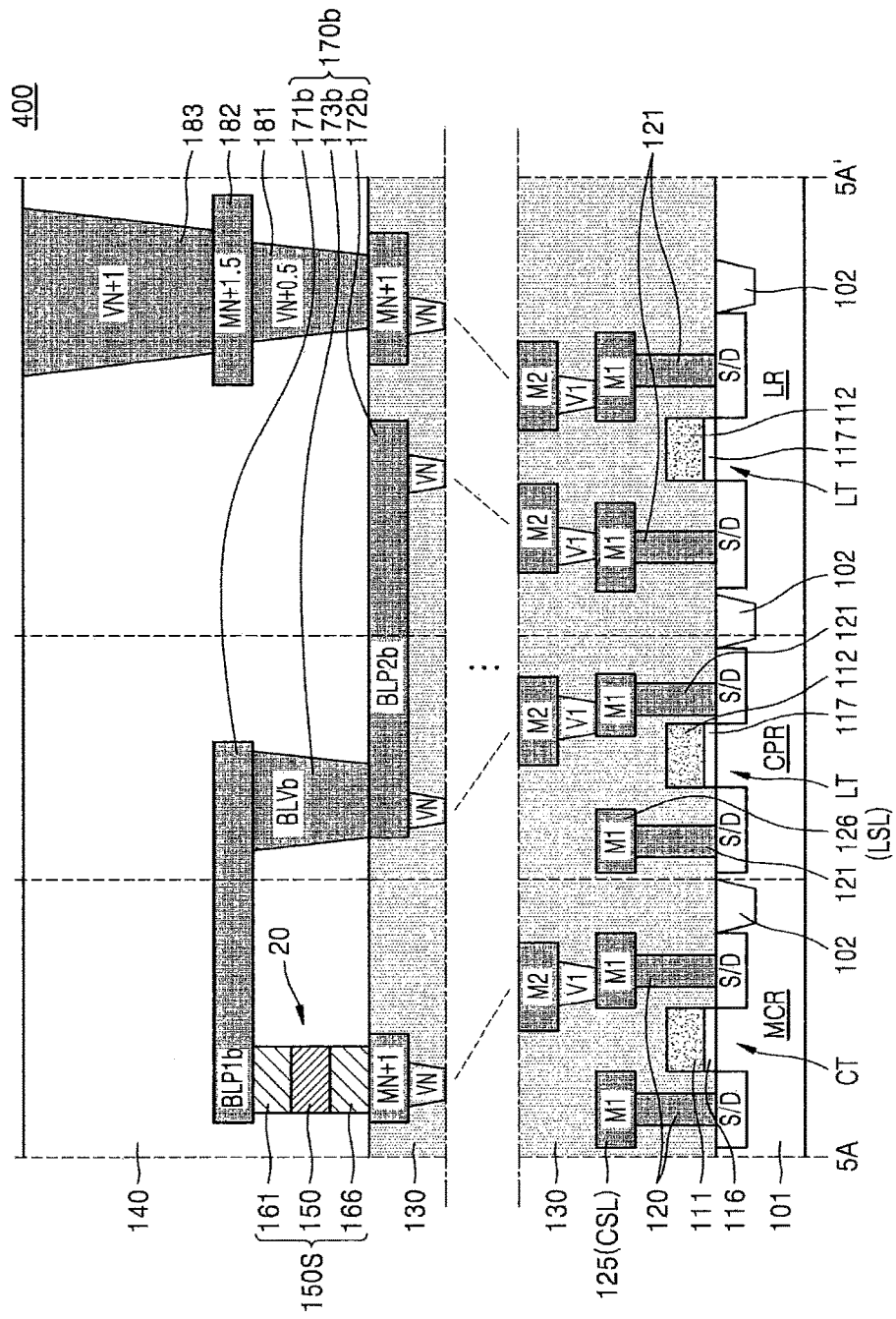
FIG. 5B is a cross-sectional view taken along a line 5A-5A' of FIG. 5A.

FIG. 5A is a plan view for explaining a semiconductor device 400 including a variable resistance memory device, according to some example embodiments. FIG. 5B is a cross-sectional view taken along a line 5A-5A' of FIG. 5A.

For convenience of description, in FIGS. 5A and 5B, the same reference numerals like in FIGS. 2A and 2B denote the same elements, and therefore, only differences will be mainly described.

Referring to FIGS. 5A and 5B, a bit line structure 170b may include a first horizontal bit line 171b (BLP1b), a second horizontal bit line 172b (BLP2b), and a vertical bit line 173b (BLVb).

The first horizontal bit line 171b may extend in a direction parallel to the upper surface of the substrate 101. The first horizontal bit line 171b may penetrate at least a portion of the first insulating layer 140. The first horizontal bit line 171b may extend over the memory cell region MCR. The first horizontal bit line 171b may extend over the core/peri region CPR. The first horizontal bit line 171b may be spaced horizontally from the logic region LR.

The second horizontal bit line 172b may extend in a direction parallel to the upper surface of the substrate 101. The second horizontal bit line 172b may extend over the logic region LR. The second horizontal bit line 172b may extend over the core/peri region CPR.

The vertical bit line 173b may extend in a direction perpendicular to the upper surface of the substrate 101. The vertical bit line 173b may penetrate at least a portion of the first insulating layer 140. The vertical bit line 173b may extend over the core/peri region CPR.

Accordingly, the first horizontal bit line 171b in the first insulating layer 140 extends over the memory cell region MCR and the core/peri region CPR, and the second horizontal bit line 172b in the second insulating layer 130, which is a low-dielectric constant layer/ultra low-dielectric constant layer, extends in the logic region LR and the core/peri region CPR to prevent RC delay.

Figure 6A:
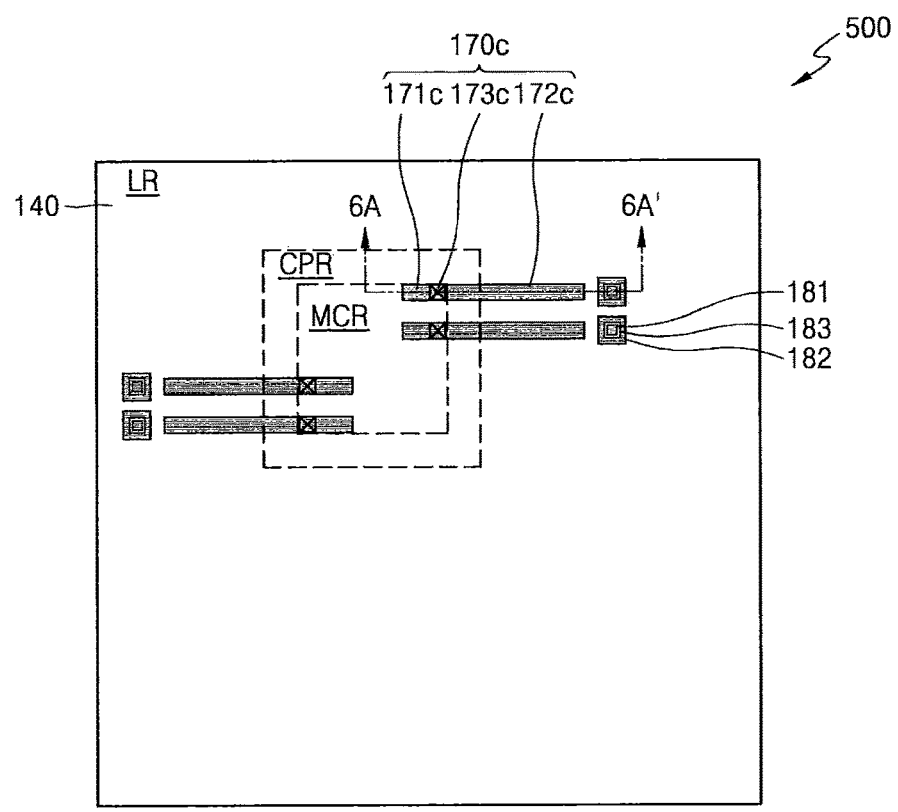
FIG. 6A is a plan view for explaining a semiconductor device including a variable resistance memory device, according to some example embodiments.
Figure 6B:
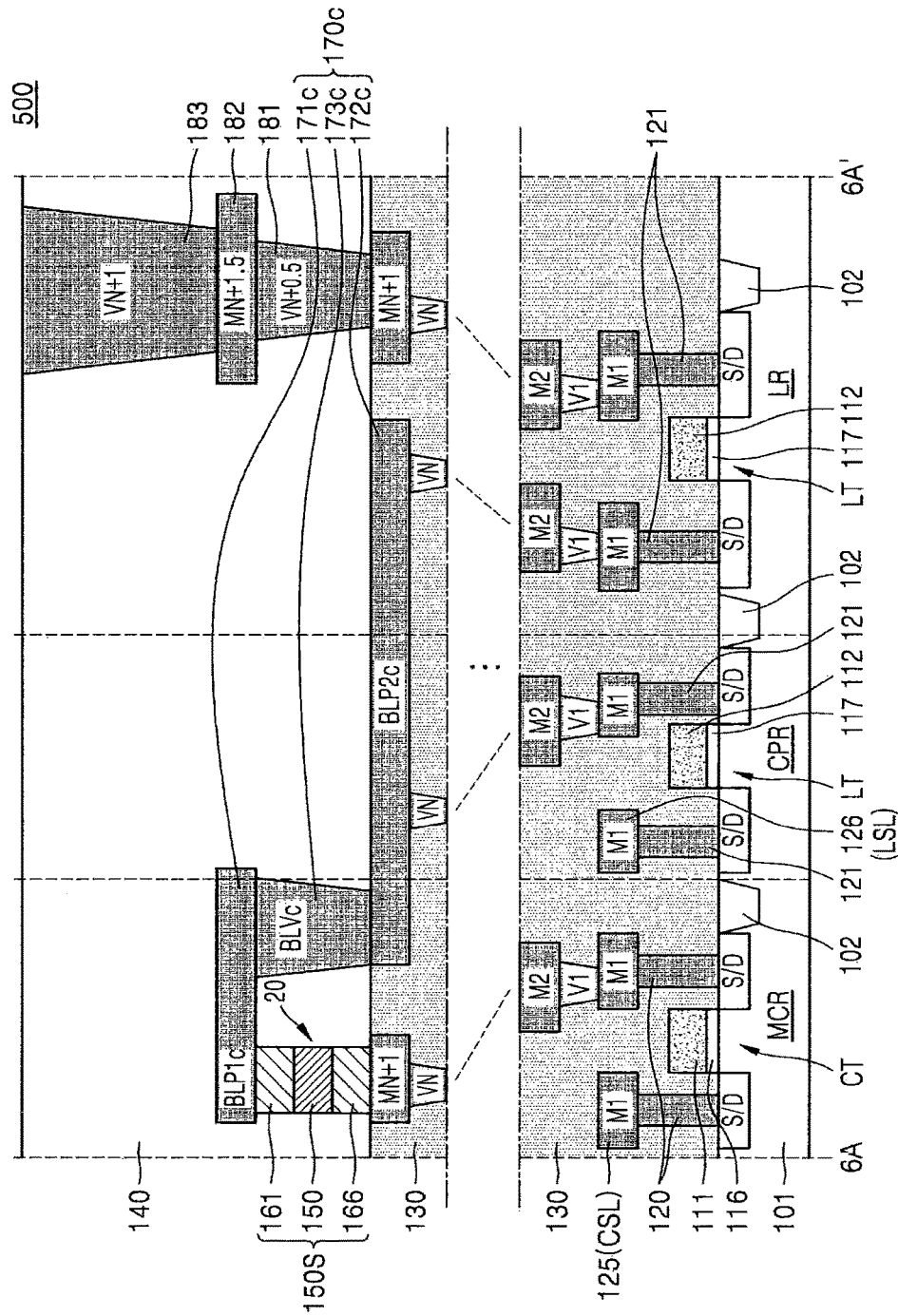
FIG. 6B is a cross-sectional view taken along a line 6A-6A' of FIG. 6A.

FIG. 6A is a plan view for explaining a semiconductor device 500 including a variable resistance memory device, according to some example embodiments. FIG. 6B is a cross-sectional view taken along a line 6A-6A' of FIG. 6A.

For convenience of description, in FIGS. 6A and 6B, the same reference numerals like in FIGS. 2A and 2B denote the same elements, and therefore, only differences will be mainly described.

Referring to FIGS. 6A and 6B, a bit line structure 170c may include a first horizontal bit line 171c (BLP1c), a second horizontal bit line 172c (BLP2c), and a vertical bit line 173c (BLVc).

The first horizontal bit line 171c may extend in a direction parallel to the upper surface of the substrate 101. The first horizontal bit line 171c may penetrate at least a portion of the first insulating layer 140. The first horizontal bit line 171c may be spaced horizontally from the core/peri region CPR and the logic region LR. The first horizontal bit line 171c may extend over the memory cell region MCR. The first horizontal bit line 171c may extend over the memory cell region MCR only.

The second horizontal bit line 172c may extend in a direction parallel to the upper surface of the substrate 101. The second horizontal bit line 172c may extend over the logic region LR. The second horizontal bit line 172c may extend over the core/peri region CPR. A portion of the second horizontal bit line 172c may extend over a portion of the memory cell region MCR adjacent to the core/peri region CPR and/or a portion of the memory cell region MCR adjacent to the logic region LR.

The vertical bit line 173c may extend in a direction perpendicular to the upper surface of the substrate 101. The vertical bit line 173c may penetrate at least a portion of the first insulating layer 140. The vertical bit line 173c may extend over the memory cell region MCR.

Accordingly, the first horizontal bit line 171c in the first insulating layer 140 extends over the memory cell region MCR, and the second horizontal bit line 172c in the second insulating layer 130, which is a low-dielectric constant layer/ultra low-dielectric constant layer, extends in the memory cell region MCR, the core/peri region CPR, and the logic region LR to reduce or prevent RC delay.

Figure 7A:
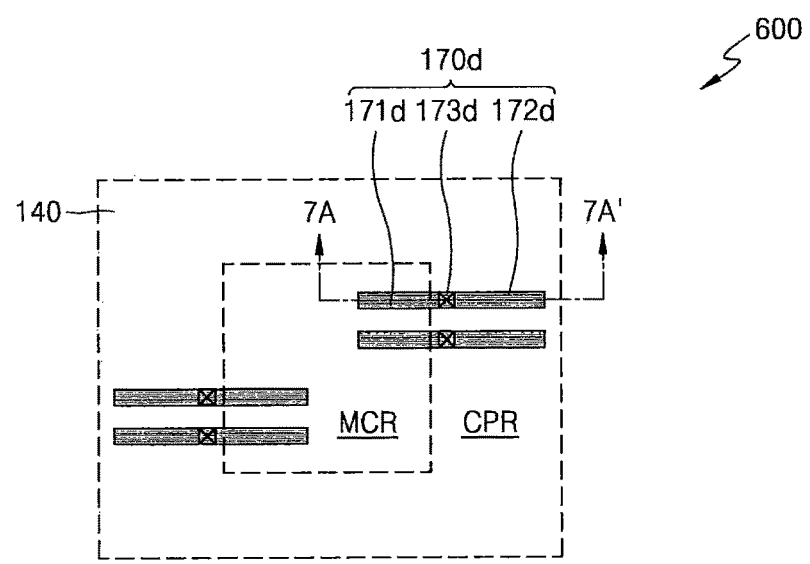
FIG. 7A is a plan view for explaining a semiconductor device including a variable resistance memory device, according to some example embodiments.
Figure 7B:
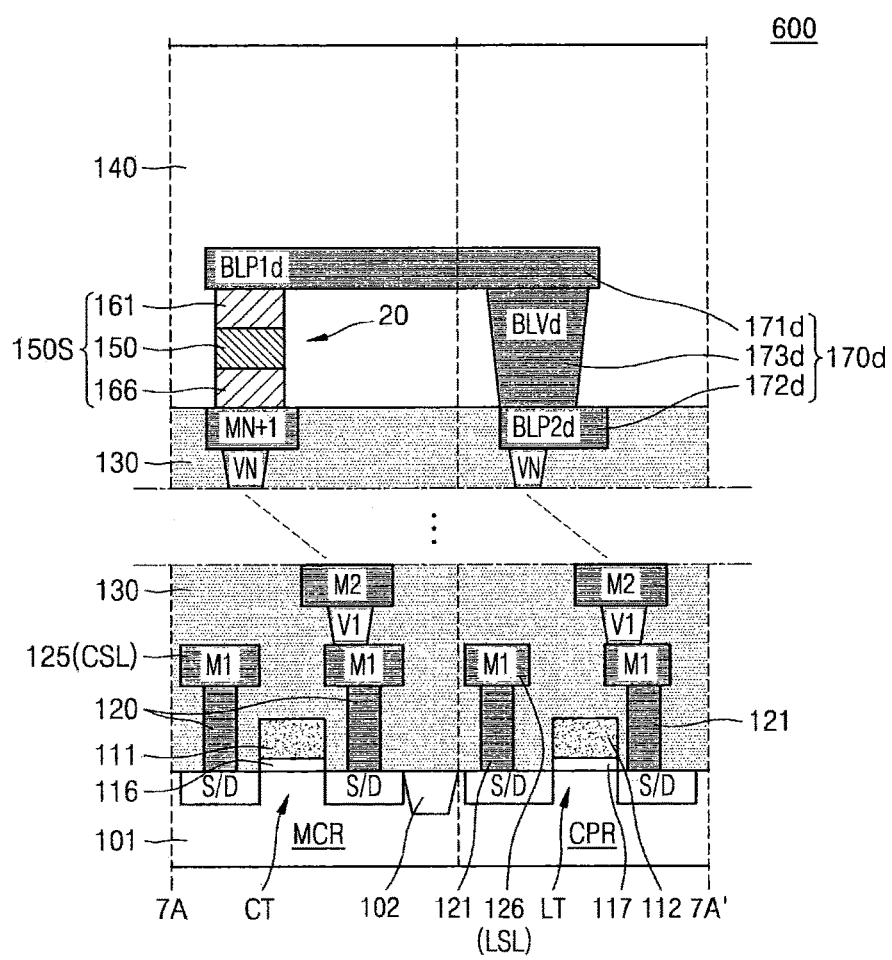
FIG. 7B is a cross-sectional view taken along a line 7A-7A' of FIG. 7A.

FIG. 7A is a plan view for explaining a semiconductor device 600 including a variable resistance memory device, according to some example embodiments. FIG. 7B is a cross-sectional view taken along a line 7A-7A' of FIG. 7A.

For convenience of description, in FIGS. 7A and 7B, the same reference numerals like in FIGS. 2A and 2B denote the same elements, and therefore, only differences will be mainly described.

Referring to FIGS. 7A and 7B, the memory cell region MCR and the core/peri region CPR may be defined over the substrate 101. That is, the semiconductor device 600 according to some example embodiments may be a semiconductor memory device rather than a System On Chip (SoC) semiconductor device including an embedded MRAM device. Therefore, the substrate 101 may include only the memory cell region MCR and the core/peri region CPR. A bit line structure 170d may include a first horizontal bit line 171d, a second horizontal bit line 172d, and a vertical bit line 173d.

The first horizontal bit line 171d may extend in a direction parallel to the upper surface of the substrate 101. The first horizontal bit line 171d may penetrate at least a portion of the first insulating layer 140. The first horizontal bit line 171d may be in the memory cell region MCR and the core/peri region CPR.

The second horizontal bit line 172d may extend in a direction parallel to the upper surface of the substrate 101. The second horizontal bit line 172d may be in the core/peri region CPR. A portion of the second horizontal bit line 172d may extend over a portion of the memory cell region MCR adjacent to the core/peri region CPR.

The vertical bit line 173d may extend in a direction perpendicular to the upper surface of the substrate 101. The vertical bit line 173d may penetrate at least a portion of the first insulating layer 140. The vertical bit line 173d may extend over the core/peri region CPR.

Accordingly, the first horizontal bit line 171d in the first insulating layer 140 extends over a portion of the core/peri region CPR adjacent to the memory cell region MCR, and the second horizontal bit line 172d in the second insulating layer 130, which is a low-dielectric constant layer/ultra low-dielectric constant layer, extends in the core/peri region CPR to reduce or prevent RC delay.

However, the inventive concepts are not limited thereto, and the vertical bit line 173d may extend over the memory cell region MCR. Accordingly, the first horizontal bit line 171d may extend over the memory cell region MCR only, and the second horizontal bit line 172d may extend over the memory cell region MCR and the core/peri region CPR.

FIGS. 8A to 8G are cross-sectional views for explaining a method of manufacturing a semiconductor device including a variable resistance memory device, according to some example embodiments. FIGS. 8A to 8H are cross-sectional views taken along the line 2A-2A' of FIG. 2A.

Figure 8A:
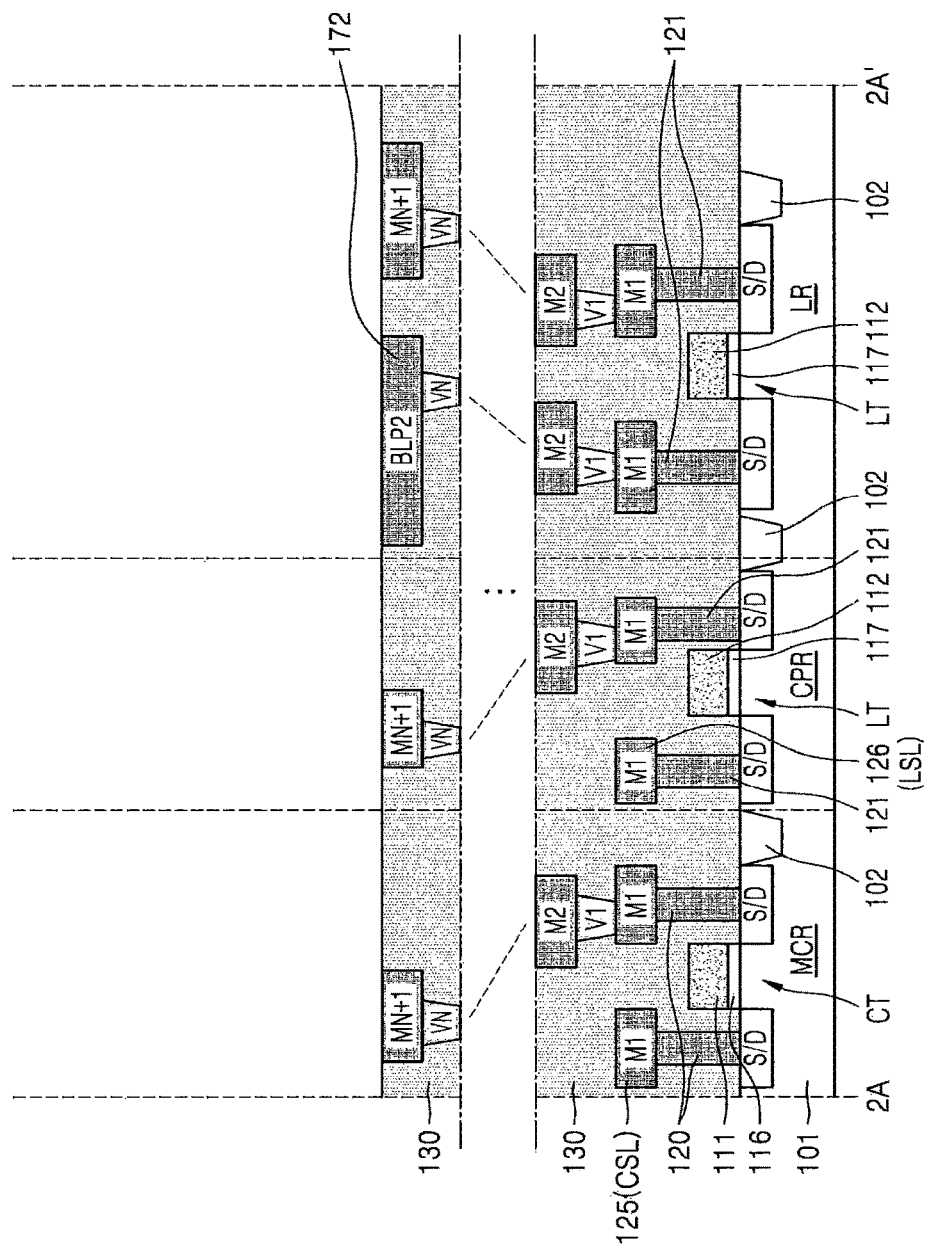
FIGS. 8A to 8G are cross-sectional views for explaining a method of manufacturing a semiconductor device including a variable resistance memory device, according to some example embodiments.

Referring to FIG. 8A, an active region may be defined by forming the element isolation layer 102 on the substrate 101 and the cell transistor CT and the logic transistor LT may be on the active region.

The gate insulating layers 116 and 117, the gate electrodes 111 and 112, and the source/drain regions S/D on the substrate 101 on both sides of the gate electrodes 111 and 112 may be on the substrate 101 to form the cell transistor CT and the logic transistor LT. Although not shown, the cell transistor CT and the logic transistor LT may be formed such that an upper surface and both sidewalls of the gate electrode 111 are insulated from each other by an insulating capping pattern and an insulating spacer.

Next, the second insulating layer 130, the conductive wiring layers (M1, M2, . . . , and MN+1), and the conductive vias (V1, . . . , VN) may be formed through a back end of line (BEOL) process. The conductive wiring layers (M1, M2, . . . , and MN+1) are formed by providing a conductive material layer and patterning the conductive material layer to provide the conductive wiring layers (M1, M2, . . . , and MN+1). An interlayer insulating layer covering the conductive wiring layers (M1, M2, . . . , and MN+1) is formed and then etched back until upper surfaces of the conductive wiring layers (M1, M2, . . . , and MN+1) are exposed. The second horizontal bit lines 172 (BLP2) may be formed simultaneously when some of the conductive wiring layers (MN+1) are formed. Some of the conductive wiring layers (M1, M2, . . . , and MN+1) may be in contact with some of the conductive vias (V1, . . . , VN) disposed immediately below the conductive wiring layers (M1, M2, . . . , and MN+1) or some of the source/drain contacts 120.

After providing an interlayer insulating layer to form the conductive vias (V1, . . . , VN), the interlayer insulating layer is patterned through a process such as photolithography to form an interlayer insulating layer pattern. A conductive material layer covering the interlayer insulating layer pattern is provided and then etched back until an upper surface of the interlayer insulating layer pattern is exposed. Some of the conductive vias (V1, . . . , VN) may contact some of the conductive wiring layers (M1, M2, . . . , and MN+1) formed immediately below the conductive vias (V1, . . . , VN).

Figure 8B:
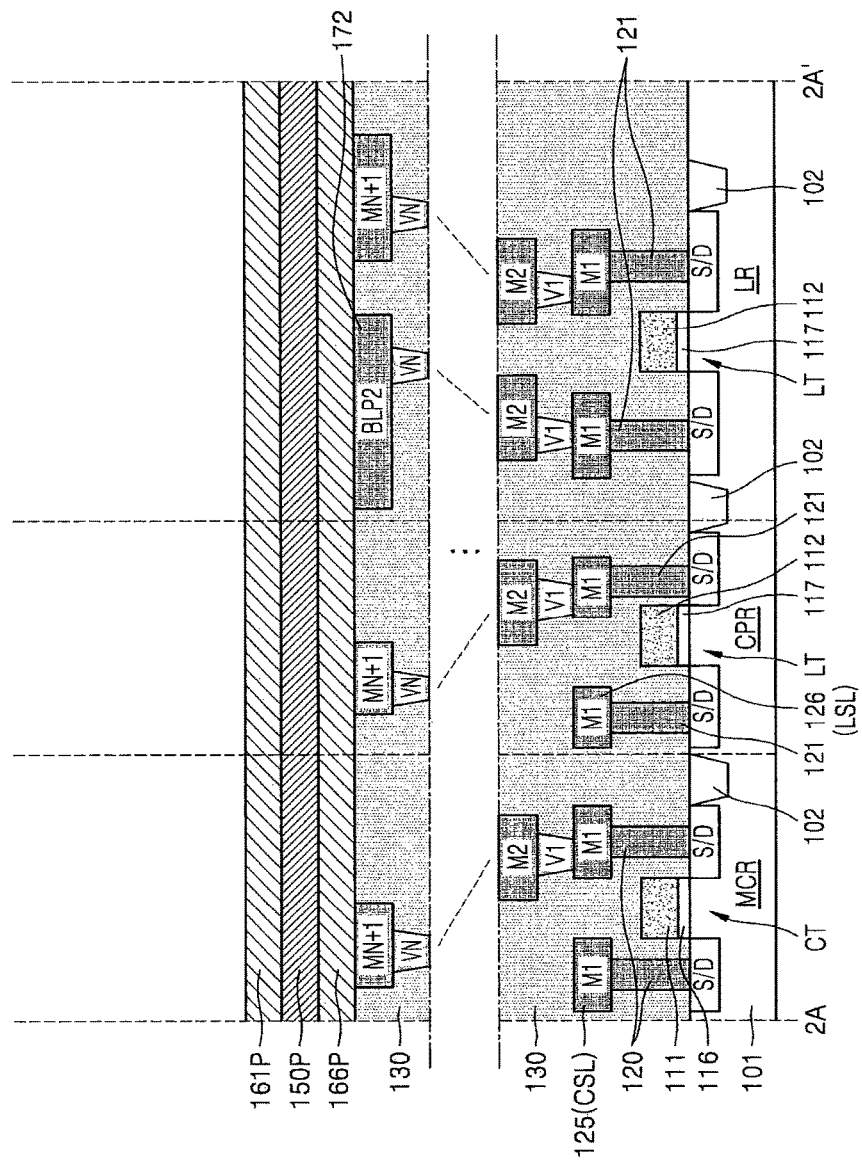

Referring to FIG. 8B, a lower electrode layer 166P, a magnetoresistive material layer 150P, and an upper electrode layer 161P may be sequentially provided on the entire surface of a substrate on the second insulating layer 130.

The lower electrode layer 166P may include substantially the same material as the lower electrode 166 (see FIG. 2B). A chemical vapor deposition (CVD) process, a physical vapor deposition (PVD) process, an atomic layer deposition (ALD) process, or a reactive PLD (pulsed laser deposition) process may be used to form the lower electrode layer 166P.

The magnetoresistive material layer 150P may include a plurality of layers. The magnetoresistive material layer 150P may include, for example, a seed layer, a free material layer, a tunnel barrier layer, a pinned material layer, and the like that are sequentially stacked.

The seed layer may include Ru, Pt, Pd, or the like and may be formed by the CVD process, the PVD process, the ALD process, the reactive PLD process, or a direct current (DC) magnetron sputtering process using krypton (Kr) as a sputtering gas. The free material layer may be formed by a molecular beam epitaxy (MBE) process or a metalorganic chemical vapor deposition (MOCVD) process and may have substantially the same composition as the free layer 152 described with reference to FIG. 1B. The tunnel barrier layer may include an oxide, a Ti nitride, or a V-nitride of any one material selected from Mg, Ti, Al, MgZn, or MgB, or a combination thereof. The pinned material layer may be formed by the MBE process or the MOCVD process and may have substantially the same composition as the pinned layer 154 described with reference to FIG. 1B.

The upper electrode layer 161P may include substantially the same material as the upper electrode 161 (see FIG. 2B). A method substantially the same as the method of forming the lower electrode layer 166P may be used in forming the upper electrode layer 161P.

Figure 8C:
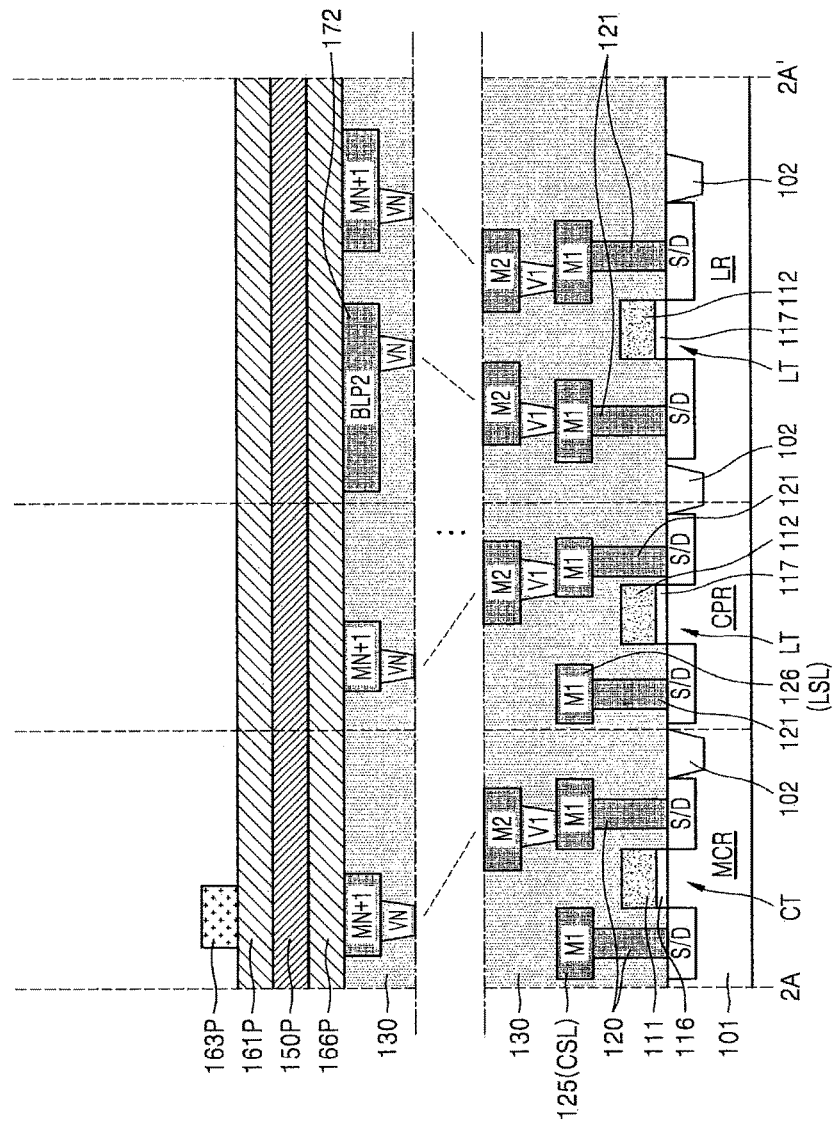

Referring to FIG. 8C, a mask pattern 163P is on the upper electrode layer 161P. In some example embodiments, the mask pattern 163P may include a metal or a metal nitride. When the mask pattern 163P includes a conductive material, the conductive material includes at least one of Ru, W, TiN, TaN, Ti, Ta, or a metallic glass alloy. For example, the mask pattern 163P may have a double layer structure of Ru/TiN or TiN/W. The mask pattern 163P may be on an axis at the same position as the position where the variable resistance structure 150S (see FIG. 8D) is to be formed.

Figure 8D:
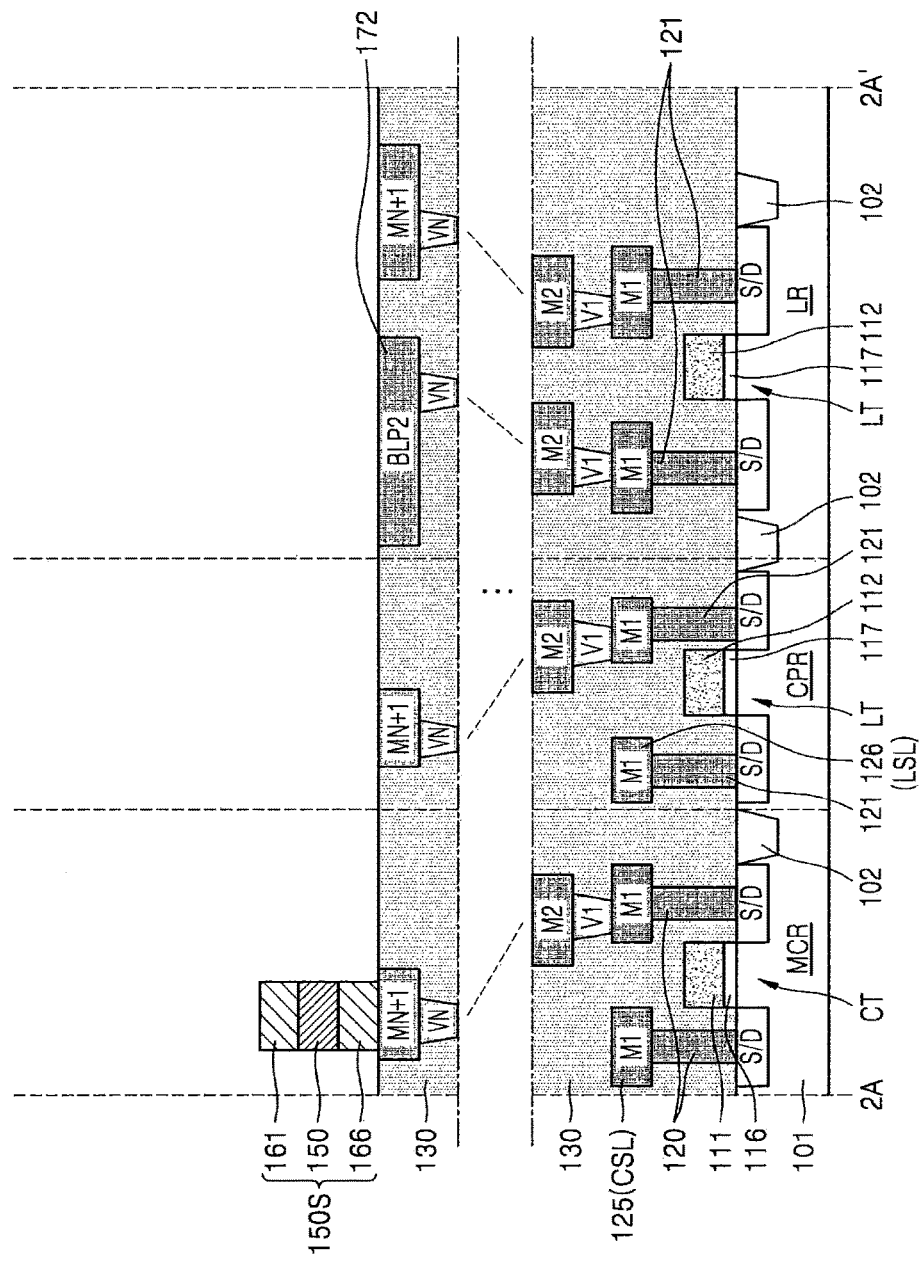

Referring to FIG. 8D, the lower electrode layer 166P (see FIG. 8C), the magnetoresistive material layer 150P (see FIG. 8C), and the upper electrode layer 161P (see FIG. 8C) may be etched using the mask pattern 163P or the plurality of mask patterns 163P as an etching mask. Accordingly, the variable resistance structure 150S including the lower electrode 166, the magnetoresistive element 150, and the upper electrode 161 may be formed. Although one variable resistance structure 150S is illustrated as being on the memory cell region MCR in drawings, a plurality of variable resistance structures 150S may be on the memory cell region MCR in rows and columns.

In order to etch the lower electrode layer 166P (see FIG. 8C), the magnetoresistive material layer 150P (see FIG. 8C), and the upper electrode layer 161P (see FIG. 8C), plasma etching, reactive ion etching (ME), ion beam etching (IBE), or argon (Ar) milling may be used. According to some example embodiments, the remaining mask pattern 163P after the etching process may form the upper portion of the upper electrode 161.

Figure 8E:
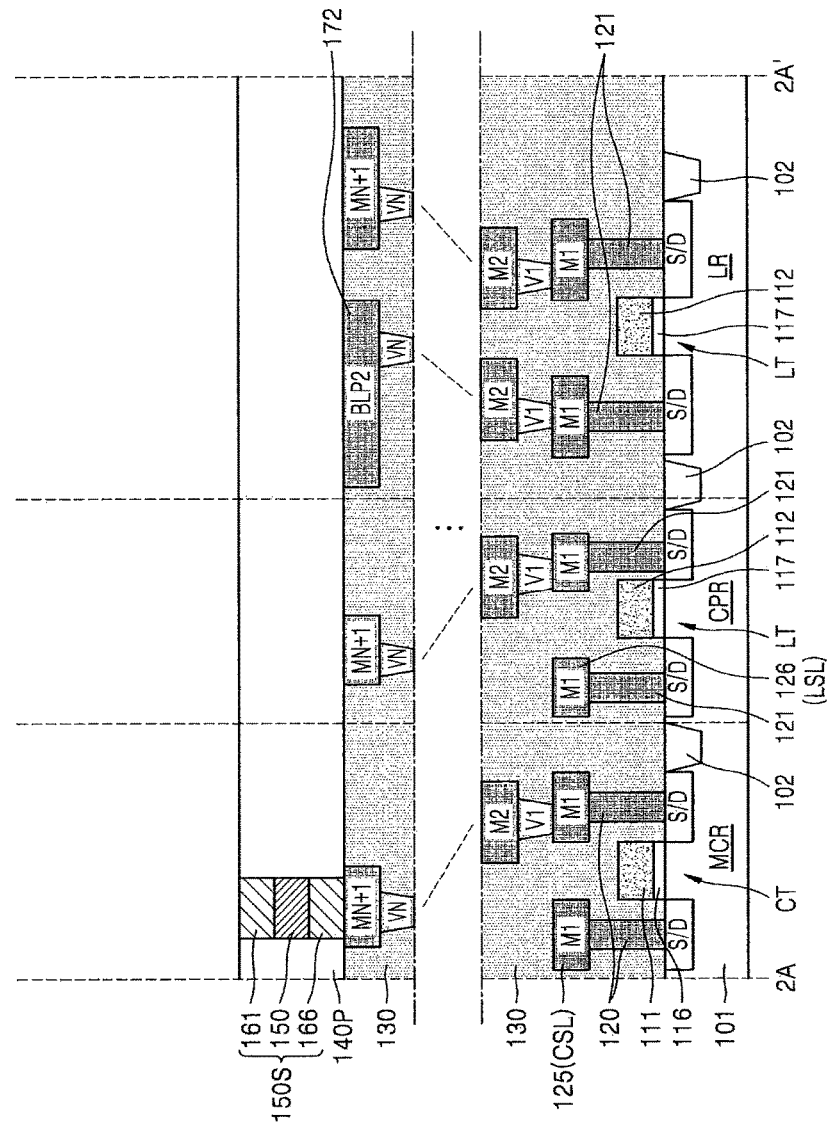

Referring to FIG. 8E, a gap-fill insulation film is sufficiently provided on the entire surface of the substrate 101, and an etch back process is performed until an upper surface of the variable resistance structure 150S is exposed, thereby forming a first insulating material layer 140P. Accordingly, a vertical length or height of the first insulating material layer 140P may be substantially the same as that of the variable resistive structure 150S.

Figure 8F:
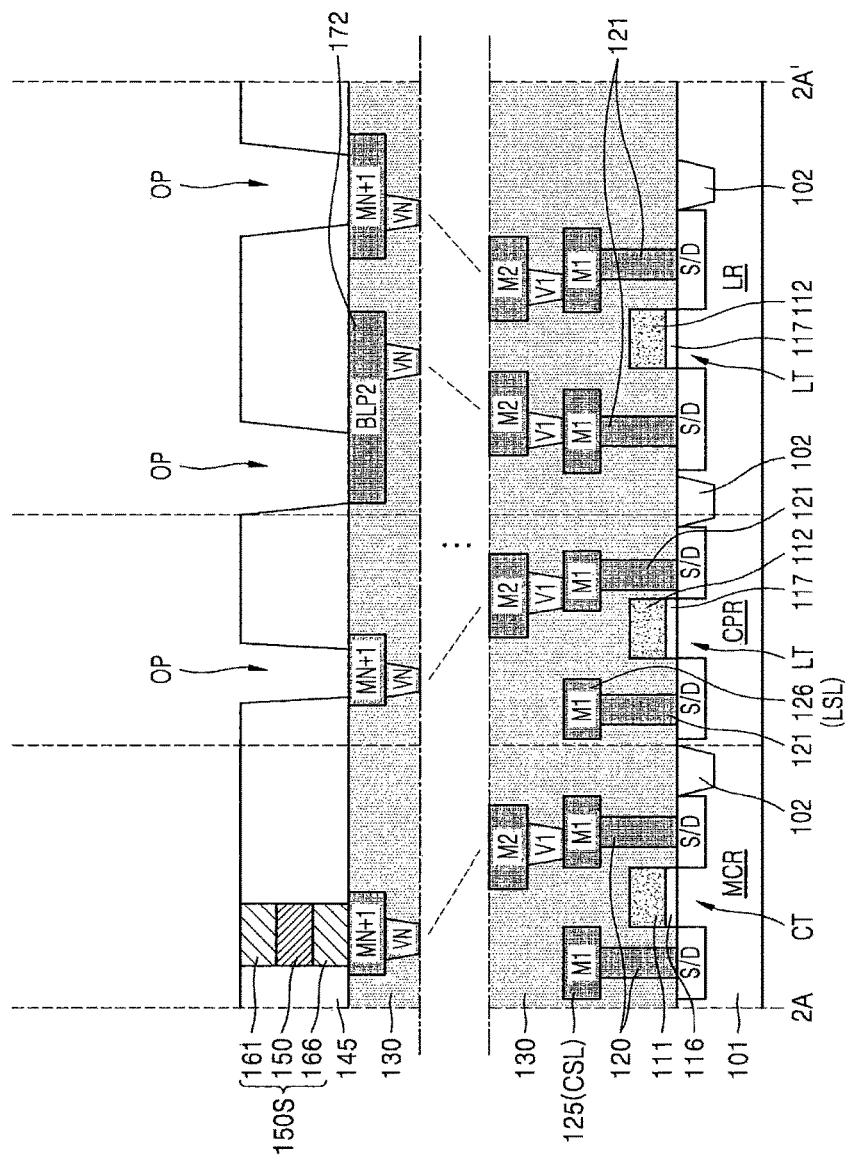

Referring to FIG. 8F, the first insulating layer 145 may be formed by etching the first insulating material layer 140P (see FIG. 8E). For this, the first insulating material layer 140P is coated with a photoresist and the coated photoresist patterned by an exposure and development process to form a photoresist pattern. A region in which openings OP are to be formed may be defined by the photoresist pattern. The first insulating layer 145 may be formed by etching the first insulating material layer 140P (see FIG. 8E) until upper surfaces of some of the conductive wiring layers (MN+1) and/or the second horizontal bit line 172 (BLP2) are exposed using the photoresist pattern as an etching mask.

Figure 8G:
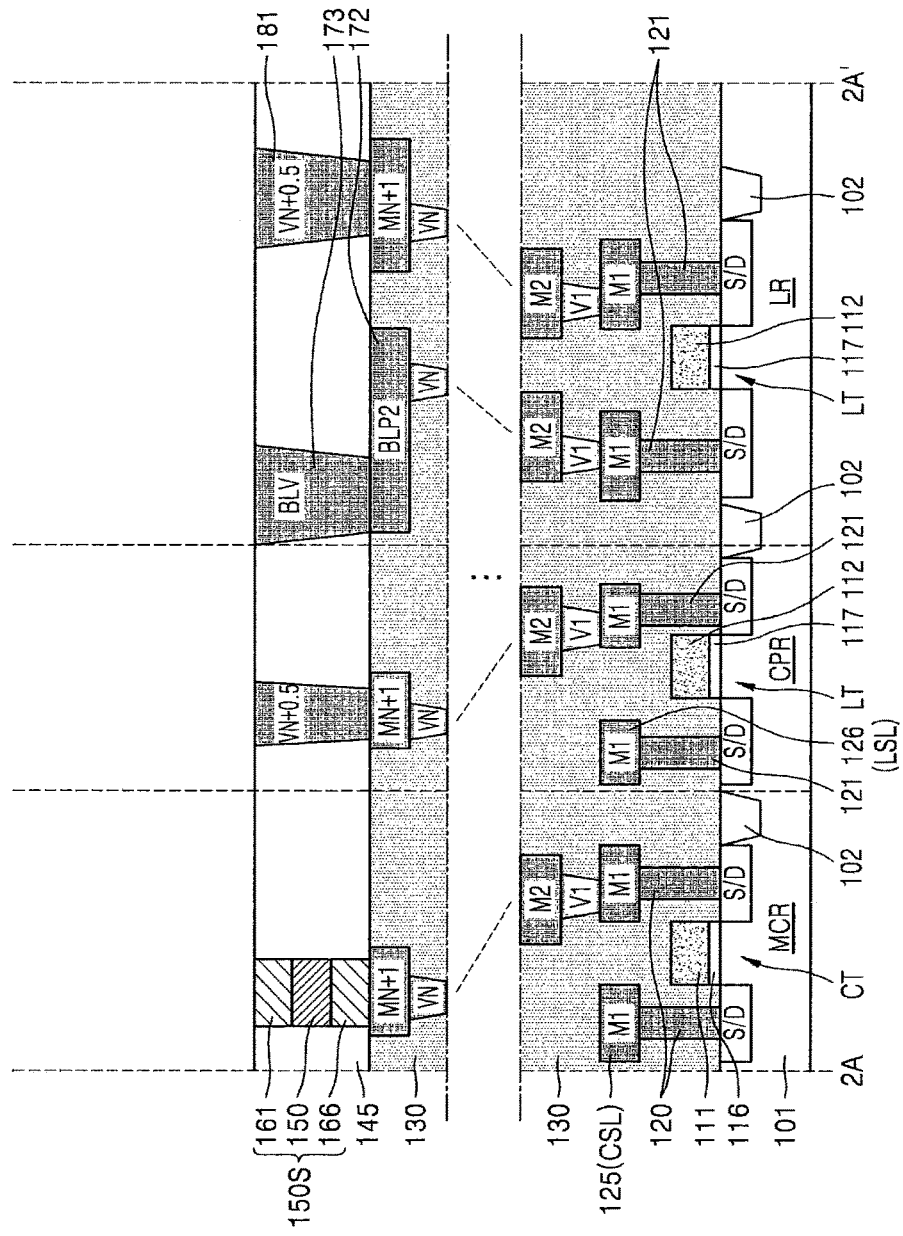

Referring to FIG. 8G, the conductive vias 181 (VN+0.5) and the vertical bit line 173 (BLV) may be formed. A conductive material layer may be provided to sufficiently fill the openings OP on the first insulating layer 145. The conductive vias 181 and the vertical bit line 173 (BLV) may be formed by performing chemical mechanical polishing (CMP) using the first insulating layer 145 as an etching stop layer. Accordingly, a vertical length or height of the vertical bit line 173 (BLV) may be substantially the same as that of the variable resistive structure 150S. In some example embodiments, a portion of an upper surface of the first insulating layer may be also etched.

Referring again to FIG. 2B, the first horizontal bit line (BLP1), the conductive wiring layers 182 (MN+1.5), and the conductive vias (VN+1) may be formed in a manner similar to the method of forming the conductive vias 181 (VN+0.5) and the vertical bit line 173 (BLV) using FIGS. 8E to 8G. Sequentially formed insulating material layers may form the first insulating layer 140 integrally, but the inventive concepts are not limited thereto.

Referring to FIG. 3B, the third insulating layer 135, the first horizontal bit line (BLP1), the conductive wiring layer 182 (MN+1.5), and the conductive vias (VN+1) may be on the first insulating layer 145.

It will be understood that when an element is referred to as being "on" or "connected to" another element, it can be directly on or connected to the other element, or intervening elements may be present. In contrast, when an element is referred to as being "directly on" or "directly connected to" another element, there are no intervening elements present. It will also be understood that, although the terms first, second, etc. may be used herein to describe various elements, these elements should not be limited by these terms. These terms are only used to distinguish one element from another element. Thus, a first element discussed herein could be termed a second element without departing from the scope of the present inventive concepts. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. The term "and/or" includes any and all combinations of one or more of the associated listed items.

While the inventive concepts have been particularly shown and described with reference to the example embodiments thereof, it will be understood that various changes in form and details may be made therein without departing from the spirit and scope of the following claims.

What is claimed is:

1. A semiconductor device comprising:
    a substrate comprising a memory cell region and a logic region;
    a variable resistance memory device on the memory cell region;
    a logic device on the logic region;
    a first horizontal bit line extending along a surface of the substrate on the memory cell region and electrically connected to the variable resistance memory device;

a second horizontal bit line extending along the surface of the substrate on the logic region and electrically connected to the logic device; and
a vertical bit line electrically connected to the first horizontal bit line and the second horizontal bit line and extending perpendicular to the surface of the substrate.

2. The semiconductor device of claim 1, wherein the variable resistance memory device comprises a magnetic tunnel junction device.

3. The semiconductor device of claim 1, wherein the variable resistance memory device comprises a surface that is coplanar with a surface of the vertical bit line.

4. The semiconductor device of claim 1, wherein the first horizontal bit line is farther away from the substrate than the second horizontal bit line.

5. The semiconductor device of claim 1, wherein the vertical bit line is on the memory cell region and is disposed in a first insulating layer in which the variable resistance memory device is disposed, wherein the first insulating layer has a different dielectric constant than a second insulating layer in which the second horizontal bit line is disposed.

6. The semiconductor device of claim 1, wherein the vertical bit line is on the logic region and is disposed in a first insulating layer in which the variable resistance memory device is disposed, wherein the first insulating layer has a different dielectric constant than a second insulating layer in which the second horizontal bit line is disposed.

7. The semiconductor device of claim 1, further comprising:
a memory cell peripheral region defined on the substrate and disposed between the memory cell region and the logic region, wherein the vertical bit line is on the memory cell peripheral region and is disposed in a first insulating layer in which the variable resistance memory device is disposed, wherein the first insulating layer has a different dielectric constant than a second insulating layer in which the second horizontal bit line is disposed.

8. The semiconductor device of claim 1, further comprising:
a first insulating layer surrounding the variable resistance memory device and a second insulating layer surrounding the second horizontal bit line, wherein a dielectric constant of the first insulating layer is greater than a dielectric constant of the second insulating layer.

9. The semiconductor device of claim 8, wherein the first insulating layer is on the second insulating layer.

10. The semiconductor device of claim 8, wherein a lower surface of the first insulating layer is coplanar with a lower surface of the variable resistance memory device.

11. The semiconductor device of claim 8, further comprising:
a third insulating layer on the first insulating layer, the third insulating layer surrounding the first horizontal bit line.

12. The semiconductor device of claim 11, wherein a dielectric constant of the first insulating layer is greater than a dielectric constant of the third insulating layer.

13. A semiconductor device comprising:
a substrate wherein a memory cell region and a logic region are defined;
a first insulating layer on the substrate;
a second insulating layer disposed between the first insulating layer and the substrate and having a dielectric constant different from that of the first insulating layer;
a variable resistance memory device in the first insulating layer;
a first horizontal bit line connected to the variable resistance memory device and extending in a direction parallel to a surface of the substrate;
a second horizontal bit line in at least a portion of the second insulating layer and extending in a direction parallel to the surface of the substrate; and
a vertical bit line in at least a portion of the first insulating layer and extending in a direction perpendicular to the surface of the substrate and electrically connected to the first horizontal bit line and the second horizontal bit line.

14. The semiconductor device of claim 13, wherein a dielectric constant of the first insulating layer is greater than a dielectric constant of the second insulating layer.

15. The semiconductor device of claim 13, wherein an upper surface of the second horizontal bit line is coplanar with an upper surface of the second insulating layer.

16. The semiconductor device of claim 15, wherein the upper surface of the second insulating layer is coplanar with a lower surface of the variable resistance memory device.

17. The semiconductor device of claim 13, wherein the variable resistance memory device comprises a magnetic tunnel junction device.

18. A semiconductor device comprising:
a substrate wherein a memory cell region and a logic region are defined;
a first insulating layer on the substrate;
a second insulating layer disposed between the first insulating layer and the substrate and having a dielectric constant different from that of the first insulating layer;
a variable resistance memory device in the first insulating layer on the memory cell region;
a logic device on the logic region;
a first horizontal bit line extending along a surface of the substrate on the memory cell region and electrically connected to the variable resistance memory device;
a second horizontal bit line in the second insulating layer and extending along the surface of the substrate on the logic region; and
a vertical bit line extending perpendicular to the surface of the substrate and electrically connected to the first horizontal bit line and the second horizontal bit line, wherein the variable resistance memory device is electrically connected to the logic device sequentially through the first horizontal bit line, the vertical bit line, and the second horizontal bit line.

19. The semiconductor device of claim 18, wherein a dielectric constant of the first insulating layer is greater than a dielectric constant of the second insulating layer.

20. The semiconductor device of claim 18, wherein the variable resistance memory device comprises a magnetic tunnel junction device.

* * * * *